United States Patent
Pullela et al.

(10) Patent No.: US 8,145,155 B2
(45) Date of Patent: Mar. 27, 2012

(54) PASSIVE MIXER AND HIGH Q RF FILTER USING A PASSIVE MIXER

(75) Inventors: Rajasekhar Pullela, Tustin, CA (US); Mohamed El Said, Irvine, CA (US)

(73) Assignee: Mediatek, Inc., Hsinchu (TW)

( * ) Notice: Subject to any disclaimer, the term of this patent is extended or adjusted under 35 U.S.C. 154(b) by 684 days.

(21) Appl. No.: 12/144,986

(22) Filed: Jun. 24, 2008

(65) Prior Publication Data
US 2008/0284487 A1   Nov. 20, 2008

Related U.S. Application Data

(63) Continuation-in-part of application No. 11/220,030, filed on Sep. 6, 2005, now Pat. No. 7,398,073.

(60) Provisional application No. 60/946,273, filed on Jun. 26, 2007.

(51) Int. Cl.
*H04B 1/04*   (2006.01)
(52) U.S. Cl. ....... 455/118; 455/168.1; 455/86; 455/146; 455/313; 455/316; 375/316; 375/317; 375/318
(58) Field of Classification Search ............ 455/118, 455/168.1, 86, 146, 313, 316; 375/316, 317, 375/318
See application file for complete search history.

(56) References Cited

U.S. PATENT DOCUMENTS

| | | | |
|---|---|---|---|
| 6,269,253 B1 | 7/2001 | Maegawa et al. | |
| 7,120,406 B2 * | 10/2006 | van der Burgt | 455/168.1 |
| 7,421,250 B2 * | 9/2008 | Shi | 455/73 |
| 7,715,802 B2 * | 5/2010 | Yoshida et al. | 455/76 |
| 7,869,781 B2 * | 1/2011 | Li et al. | 455/230 |
| 2002/0055337 A1 | 5/2002 | Persico et al. | |
| 2003/0021237 A1 | 1/2003 | Min et al. | |
| 2003/0169089 A1 | 9/2003 | Manku et al. | |
| 2003/0176177 A1 * | 9/2003 | Molnar et al. | 455/323 |
| 2004/0077324 A1 | 4/2004 | Wieck | |
| 2007/0054648 A1 | 3/2007 | Pullela et al. | |
| 2007/0126500 A1 * | 6/2007 | Mattisson et al. | 330/10 |
| 2007/0270109 A1 * | 11/2007 | Lin | 455/114.1 |
| 2007/0287403 A1 * | 12/2007 | Sjoland | 455/326 |
| 2008/0248775 A1 * | 10/2008 | Tsai et al. | 455/326 |

FOREIGN PATENT DOCUMENTS

| | | |
|---|---|---|
| CN | 1914790 | 2/2007 |
| JP | 10-126174 | 5/1998 |
| JP | 2003-060441 | 2/2003 |
| JP | 2003-188649 | 7/2003 |
| JP | 2005-197836 | 7/2005 |
| JP | 2005-524329 | 8/2005 |
| WO | WO 03/023983 | 3/2003 |
| WO | WO 2004/001997 | 12/2003 |

(Continued)

OTHER PUBLICATIONS

English language translation of abstract of JP 10-126174 (published May 15, 1998).

(Continued)

*Primary Examiner* — Sanh Phu
(74) *Attorney, Agent, or Firm* — Thomas|Kayden

(57) ABSTRACT

A passive mixer include a switching architecture configured to generate differential in-phase (I) and differential quadrature-phase (Q) signals using differential components of the in-phase (I) and quadrature-phase (Q) signals operating on transitions of an approximate 25% duty cycle signal.

13 Claims, 18 Drawing Sheets

FOREIGN PATENT DOCUMENTS

WO    WO 2006/002994    1/2006

OTHER PUBLICATIONS

English language translation of abstract of JP 2003-060441 (published Feb. 28, 2003).

English language translation of abstract of JP 2003-188649 (published Jul. 4, 2003).

English language translation of abstract of JP 2005-197836 (published Jul. 21, 2005).

English language translation of abstract of JP 2005-524329 (published Aug. 11, 2005).

Petrov, A.R.; "System Approach for Low 1/f Noise, High IP2 Dynamic Range CMOS Mixer Design;" University/Government/Industry Microelectronics Symposium, 2003. Proceedings of the 15th biennial, Jun. 30-Jul. 2, 2003; pp. 74-78.

English language translation of abstract of CN 1914790 (published Feb. 14, 2007).

* cited by examiner

US 8,145,155 B2

PASSIVE MIXER AND HIGH Q RF FILTER USING A PASSIVE MIXER

CROSS-REFERENCE TO RELATED APPLICATIONS

This application claims priority to and the benefit of the filing date of U.S. Provisional Patent Application No. 60/946,273, filed on Jun. 26, 2007, entitled "High Performance Passive Mixer Using 2*LO/LO Topology," the entire disclosure of which is hereby incorporated herein by reference; and is a continuation-in-part of U.S. patent application Ser. No. 11/220,030, filed on Sep. 6, 2005, entitled "Low Noise Mixer," now U.S. Pat. No. 7,398,073 issued on Jul. 8, 2008, the entire disclosure of which is hereby incorporated herein by reference.

BACKGROUND

Portable communication devices, such as cellular telephones, personal digital assistants (PDAs), WIFI transceivers, and other communication devices transmit and receive communication signal at various frequencies. For efficient communication, the frequency of the transmit and receive signals is many times higher than the baseband information signal that carries the information to be communicated. Therefore, a transceiver must upconvert the transmit signal and downconvert the receive signal.

Usually, one or more mixers are used to upconvert the transmit signal and downconvert the receive signal. In many radio frequency (RF) communication methodologies, and in a quadrature modulation methodology in particular, a mixer can be implemented using a series of switches that switch differential components of a quadrature signal according to a local oscillator (LO) signal. The frequency of the LO signal is chosen so that a radio frequency signal mixed with the LO signal is converted to a desired frequency.

Signal upconversion and signal downconversion is performed by using mixers, which are typically implemented using semiconductor switches. In deep sub-micron technology the availability of passive switches providing low noise operation and highly efficient operating characteristics enables the use of passive mixers where low current consumption and high performance is desired. Rail to rail voltages used in the switch clock path and issues due to poor isolation between the in-phase (I) and quadrature-phase (Q) paths in the mixer impose limitations on the use of a passive mixer.

SUMMARY

Embodiments of a passive mixer include a switching architecture configured to generate differential in-phase (I) and differential quadrature-phase (Q) signals using differential components of the in-phase (I) and quadrature-phase (Q) signals operating on transitions of an approximate 25% duty cycle signal.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
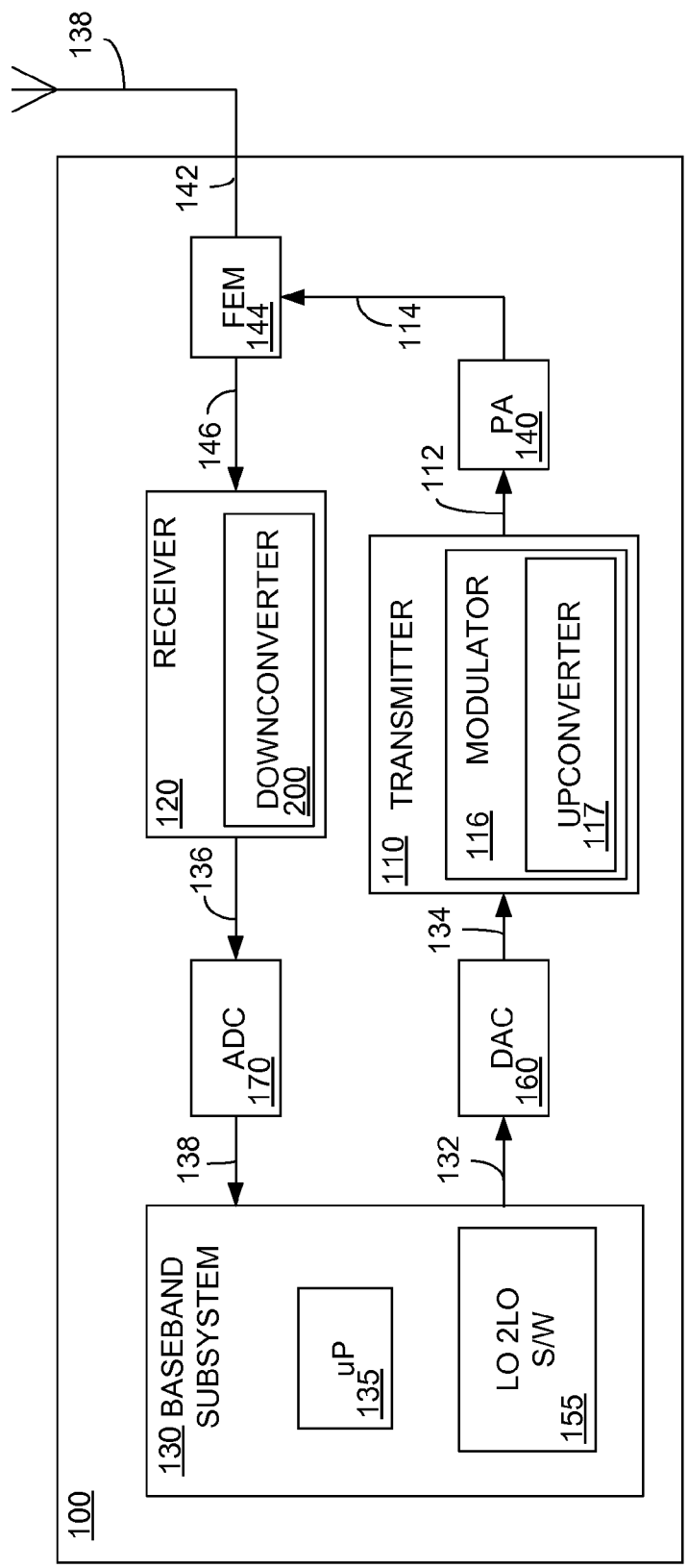
FIG. 1 is a block diagram illustrating a simplified portable transceiver.

Although described with particular reference to a portable transceiver, the passive mixer and high Q RF filter using a passive mixer, also referred to in an alternative embodiment as the passive mixer and high Q RF filter using an approximate 25% clock duty cycle waveform for local oscillator (LO) generation, which may be realized using a LO 2LO topology, can be used in any device that uses signal downconversion in a receiver. The passive mixer and high Q RF filter using a passive mixer can be implemented in the mixer core, or can be implemented in a conventional mixer core by generating the desired LO and 2LO signals in related circuitry. Further, while described below in the context of a downconverting mixer, the passive mixer and high Q RF filter using a passive mixer can also be implemented as an upconverting mixer. Further, a filter architecture using an approximate 25% duty cycle topology is described. This filter architecture can be used in any design that requires a high Q radio frequency (RF) filter. In this application, a quadrature passive mixer topology is described. The passive quadrature mixer topology can be used in both receive and transmit applications and achieves excellent isolation between the I and Q paths, low noise and high linearity while relaxing stringent LO chain specifications.

A passive mixer offers low power consumption, low noise and high linearity, but requires better performance from the LO driver and the signal path that follows the passive mixer. The most problematic drawback of a passive mixer is the lack of isolation between I and Q inputs. This lack of isolation forces conventional implementations into active or passive circuit stages that isolate the I and Q, at the expense of die area, adding noise and also significantly degrading linearity, thus limiting the effective use of a passive mixer in many applications.

The generation of quadrature I and Q LO signals is also important to mixer operation. Since both phase noise and I-Q matching of the quadrature LO signals are important, the circuitry related to the generation of the LO and 2LO signals typically consumes high power and occupies a large area on the circuit.

The passive mixer and high Q RF filter using a passive mixer overcomes many of the challenges described above. The passive mixer and high Q RF filter using a passive mixer significantly reduces the contribution of LO chain phase noise to the overall system noise. In the case of a transmit mixer the LO 2LO topology reduces the overall noise floor of the transmitter while in the case of a receiver the LO 2LO topology enhances the receiver's immunity to blocking signals that are far out of band that downconvert into the desired band due to reciprocal mixing. The passive mixer and high Q RF filter using a passive mixer also reduces the effect of I-Q imbalance in the LO chain that degrades the sideband rejection in the case of an upconverter and improves image rejection in the case of a downcoverter.

In the case of a receive mixer, the LO 2LO topology significantly improves the noise figure and linearity. It also increases receiver gain and reduces complexity in the RF path by eliminating components that provide active isolation (or components that provide passive isolation that can occupy significant area and/or contribute noise and degrade linearity between the I and Q paths.

Performance of passive mixers has improved dramatically over time with the availability of lower gate length, higher performance complementary metal-oxide semiconductor (CMOS) transistors, which operate as excellent switches in the linear mode. The LO 2LO passive mixer architecture described herein can further enhance the performance of a passive mixer, whether operating in voltage mode or current mode. In an embodiment, the passive mixer implementation described below is a current mode passive mixer implementation that offers a number of advantages.

The passive mixer and high Q RF filter using a passive mixer can be implemented in hardware, software, or a combination of hardware and software. When implemented in hardware, the passive mixer and high Q RF filter using a passive mixer can be implemented using specialized hardware elements and logic. When the passive mixer and high Q RF filter using a passive mixer is implemented partially in software, the software portion can be used to precisely control the various components when generating the LO and 2LO signals. The software can be stored in a memory and executed by a suitable instruction execution system (microprocessor). The hardware implementation of the passive mixer and high Q RF filter using a passive mixer can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for passive mixer and high Q RF filter using a passive mixer comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. Embodiments of the passive mixer and high Q RF filter using a passive mixer can be implemented in any RF receiver, RF transmitter or RF transceiver, and in this example, are implemented in an RF receiver 120 associated with a portable transceiver 100. The portable transceiver 100 illustrated in FIG. 1 is intended to be a simplified example and to illustrate one of many possible applications in which the passive mixer and filter using LO 2LO topology can be implemented. One having ordinary skill in the art will understand the operation of a portable transceiver. The portable transceiver 100 includes a transmitter 110, a receiver 120, a baseband subsystem 130, a digital-to-analog converter (DAC) 160 and an analog-to-digital converter (ADC) 170. The transmitter 110 includes a modulator 116 and an upconverter 117. In an embodiment, the upconverter 117 can be a subsystem of the modulator 116. In alternative embodiments, the upconverter 117 can be a separate circuit block or circuit element.

The transmitter also includes any other functional elements that modulate and upconvert a baseband signal. The receiver 120 includes filter circuitry and a downconverter 200 that enable the recovery of the information signal from the received RF signal. The downconverter 200 implements embodiments of the passive mixer and filter using LO 2LO topology, as described herein.

The portable transceiver 100 also includes a power amplifier 140. The output of the transmitter 110 is provided over connection 112 to the power amplifier 140. Depending on the communication methodology, the portable transceiver may also include a power amplifier control element (not shown).

The receiver 120 and the power amplifier 140 are connected to a front end module 144. The front end module 144 can be a duplexer, a diplexer, or any element that separates the transmit signal from the receive signal. The front end module 144 is connected to an antenna 138 over connection 142.

In transmit mode, the output of the power amplifier 140 is provided to the front end module 144 over connection 114. In receive mode, the front end module 144 provides a receive signal to the receiver 120 over connection 146.

If portions of the passive mixer and filter using LO 2LO topology are implemented in software, then the baseband subsystem 130 also includes LO 2LO software 155 that can be executed by a microprocessor 135, or by another processor, to control the operation of the passive mixer and filter using LO 2LO topology to be described below.

When transmitting, the baseband transmit signal is provided from the baseband subsystem 130 over connection 132 to the DAC 160. The DAC 160 converts the digital baseband transmit signal to an analog signal that is supplied to the transmitter 110 over connection 134. The modulator 116 and the upconverter 117 modulate and upconvert the analog transmit signal according to the modulation format prescribed by the system in which the portable transceiver 100 is operating. The modulated and upconverted transmit signal is then supplied to the power amplifier 140 over connection 112.

When receiving, the filtered and downconverted receive signal is supplied from the receiver 120 to the ADC 170 over connection 136. The ADC digitizes the analog receive signal and provides the analog baseband receive signal to the baseband subsystem 130 over connection 138. The baseband subsystem 130 recovers the transmitted information.

Figure 2:
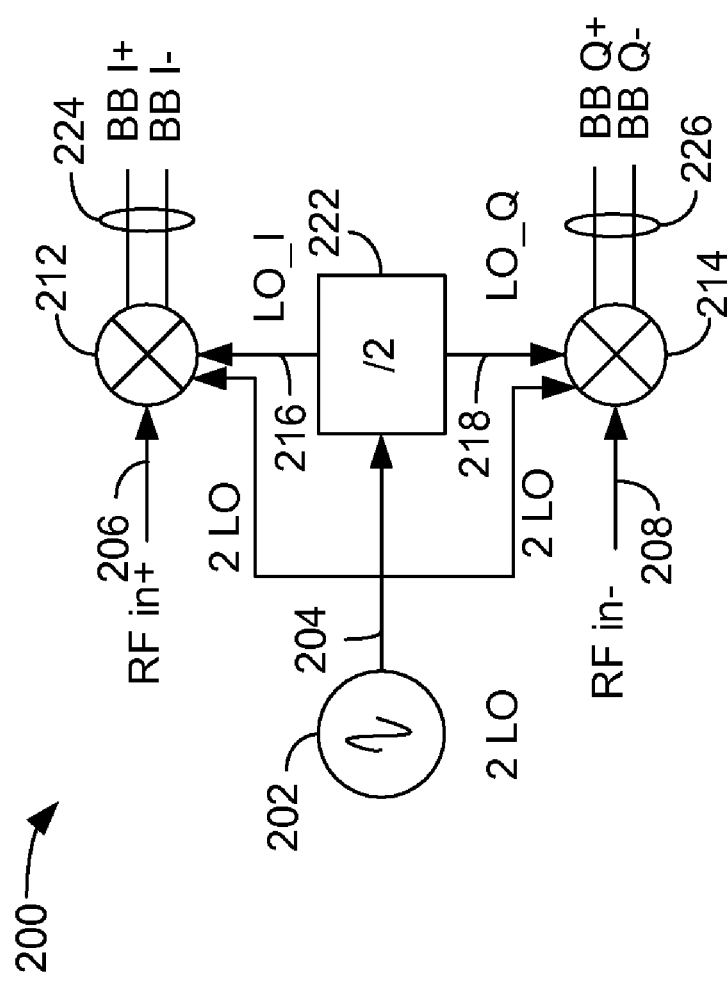
FIG. 2 is a simplified schematic diagram illustrating an embodiment of a downconverter that can implement the passive mixer and filter using the approximate 25% duty cycle or LO 2LO topology.

FIG. 2 is a simplified schematic diagram illustrating an embodiment of a downconverter 200 that can implement the passive mixer using the approximate 25% duty cycle or LO 2LO topology. The downconverter 200 includes an oscillator 202 configured to generate an LO signal on connection 204 that is twice the frequency of the desired LO signal. For example, if the desired LO frequency is a nominal 1000 MHz, the signal on connection 204 is nominally 2000 MHz. The downconverter 200 also includes a mixer core 212 and a mixer core 214. The mixer cores 212 and 214 are arranged to operate on the quadrature signals I and Q. In an example, a differential radio frequency (RF in +) input signal is supplied over connection 206 to the mixer core 212 and a differential RF input signal (RF in−) is supplied over connection 208 to the mixer core 214.

The 2LO signal on connection 204 is supplied to the mixer cores 212 and 214, and is also supplied to a divider 222. In an embodiment, the divider 222 is a quadrature divider. The divider 222 divides the 2LO signal on connection 204 to a nominal value of LO on connections 216 and 218. In this example, an LO_I signal is supplied to the mixer core 212 over connection 216 and an LO_Q signal is supplied to the mixer core 214 over connection 218. Typically, the 2LO, the LO-I and the LO_Q signals will pass through buffers before being supplied to the mixer cores 212 and 214. However, the buffers are omitted from FIG. 2 for simplicity.

As will be described in greater detail below, the mixer cores 212 and 214 each receive the LO signal and the 2LO signal. The mixer core 212 downconverts the RF in+ signal and the mixer core 214 downconverts RF in− signal with minimal noise and impairments. In this example, the downconverted RF in+ signal appears as the baseband (BB) I+ and I− signals on connection 224 and the downconverted RF in− signal appears as the baseband (BB) Q+ and Q− signals on connection 226.

The architecture of the downconverter 200 suppresses the noise contribution of the frequency divider that is used to generate the quadrature LO signals, LO_I and LO_Q, and therefore, minimizes receiver noise contribution and provides a high level of input isolation between the I and Q inputs for a passive mixer implementation.

Figure 3:
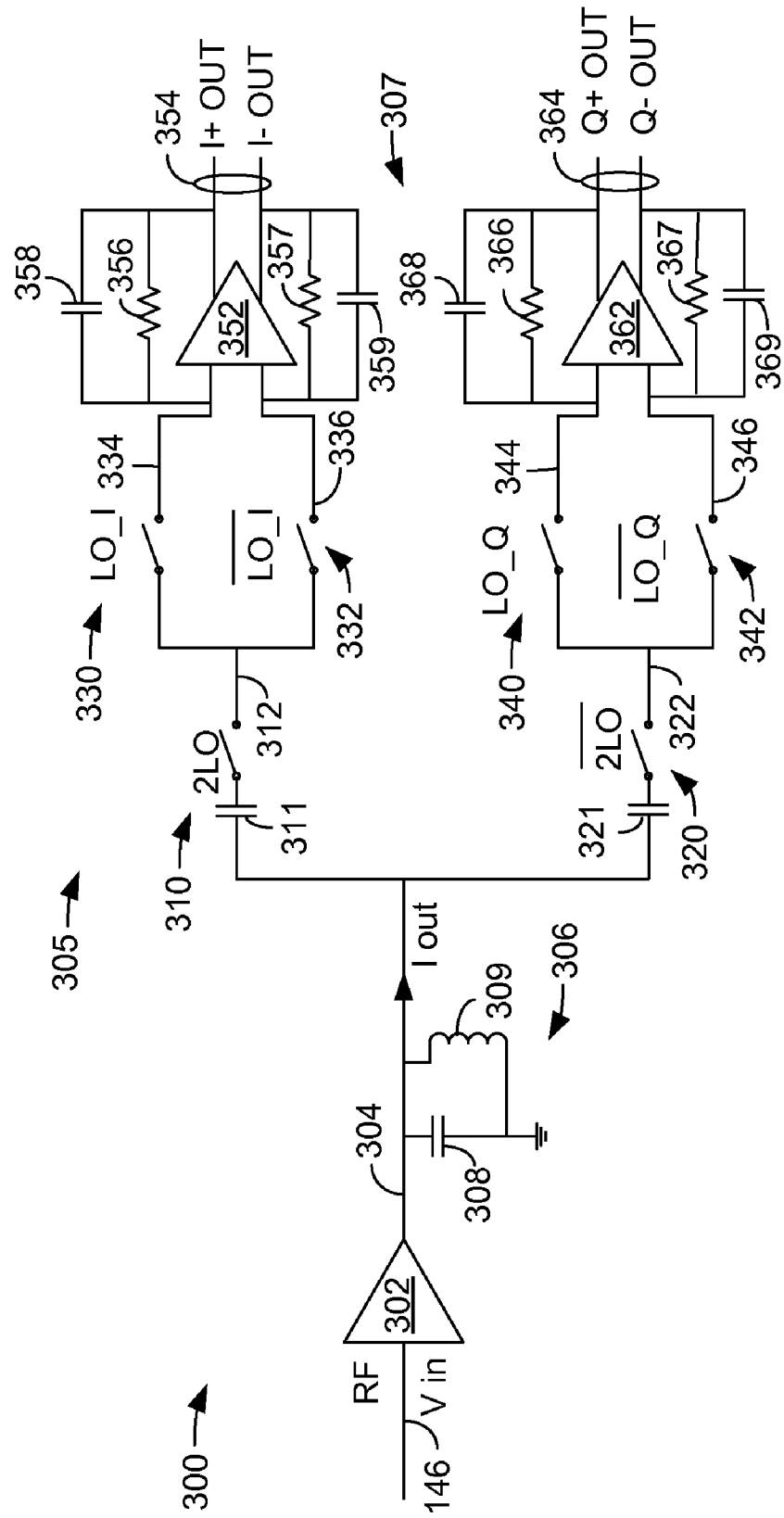
FIG. 3 is a schematic diagram illustrating an embodiment of a single-ended current-mode passive mixer implementing the approximate 25% duty cycle using LO 2LO topology.

FIG. 3 is a schematic diagram illustrating an embodiment of a single-ended current-mode passive mixer implementing the approximate 25% duty cycle using the LO 2LO topology. In the embodiment shown in FIG. 3, the mixer 300 operates in the current domain rather than in the voltage domain, and is single-ended at the RF input, but differential at the baseband output. The output of the front end module 144 (FIG. 1) is received over connection 146. This is the input signal to the receiver 120 of FIG. 1. The input signal on connection 146 is supplied to a low noise amplifier (LNA) 302. In an embodiment, the amplifier 302 can be a trans-impedance amplifier, otherwise known as a Gm stage. The input to the amplifier 302 on connection 146 is a voltage signal, Vin, while the output of the amplifier 302 on connection 304 is a current signal.

The current signal on connection 304 is provided to a inductive/capacitive (LC) tank circuit 306. The tank circuit 306 includes a capacitance 308 and an inductance 309. The tank circuit 306 is tuned to the desired RF frequency so that it provides a high impedance connection to ground or Vcc from node 304. This high impedance connection diverts the current from the output of the Gm stage to the passive mixer stages. The output of the tank circuit 306 on connection 304 is a current signal, referred to as Iout.

The mixer core includes an in-phase mixer core 305 and a quadrature-phase mixer core 307. The signal on connection 304 is provided to a pair of switches 310 and 320 through respective capacitances 311 and 321. The switch 310 is controlled by the 2LO signal and the switch 320 is controlled by the inverse of the 2LO signal, $\overline{2LO}$.

The output of the switch 310 is provided over connection 312 to switches 330 and 332. The switch 330 is controlled by the LO_I signal and the switch 332 is controlled by the $\overline{LO\_I}$ signal.

The output of the switch 320 is provided over connection 322 to switches 340 and 342. The switch 340 is controlled by the LO_Q signal and the switch 342 is controlled by the $\overline{LO\_Q}$ signal.

The output of the switch 330 is provided over connection 334 to an amplifier 352. Similarly, the output of the switch 332 is provided over connection 336 to the amplifier 352. The amplifier 352 can be, for example, a trans-impedance amplifier having a differential output on connection 354. The output on connection 354 is the differential in-phase (I) output signal. A load resistance 356 and a capacitance 358 are located between the output 354 and the input 334. A load resistance 357 and a capacitance 359 are located between the output 354 in the input 336.

The output of the switch 340 is provided over connection 344 to an amplifier 362. Similarly, the output of the switch 342 is provided over connection 346 to the amplifier 362. The amplifier 362 can be similar to the amplifier 352. The output on connection 364 is the differential quadrature-phase (Q) output signal. A resistance 366 and a capacitance 368 are located between the output 364 and the input 344. A resistance 367 and a capacitance 369 are located between the output 364 and the input 346.

The trans-impedance amplifier 352 creates a virtual ground connection for the differential signal at nodes 334 and 336, and the trans-impedance amplifier 362 creates a virtual ground connection for the differential signal at nodes 344 and 346. This enables the signals to remain in current domain as they propagate from the output of the LNA 302 through the switches in the mixer cores 305 and 307.

In accordance with an embodiment of the mixer topology shown in FIG. 3, there is no RF or basedband voltage swing on connections 334 and 336, or on connections 344 and 346. Similarly, there is no voltage swing on node 304. The low voltage gain on nodes 304, 334, 336, 344 and 346 enables the receiver front-end to operate with high linearity.

Figure 5:
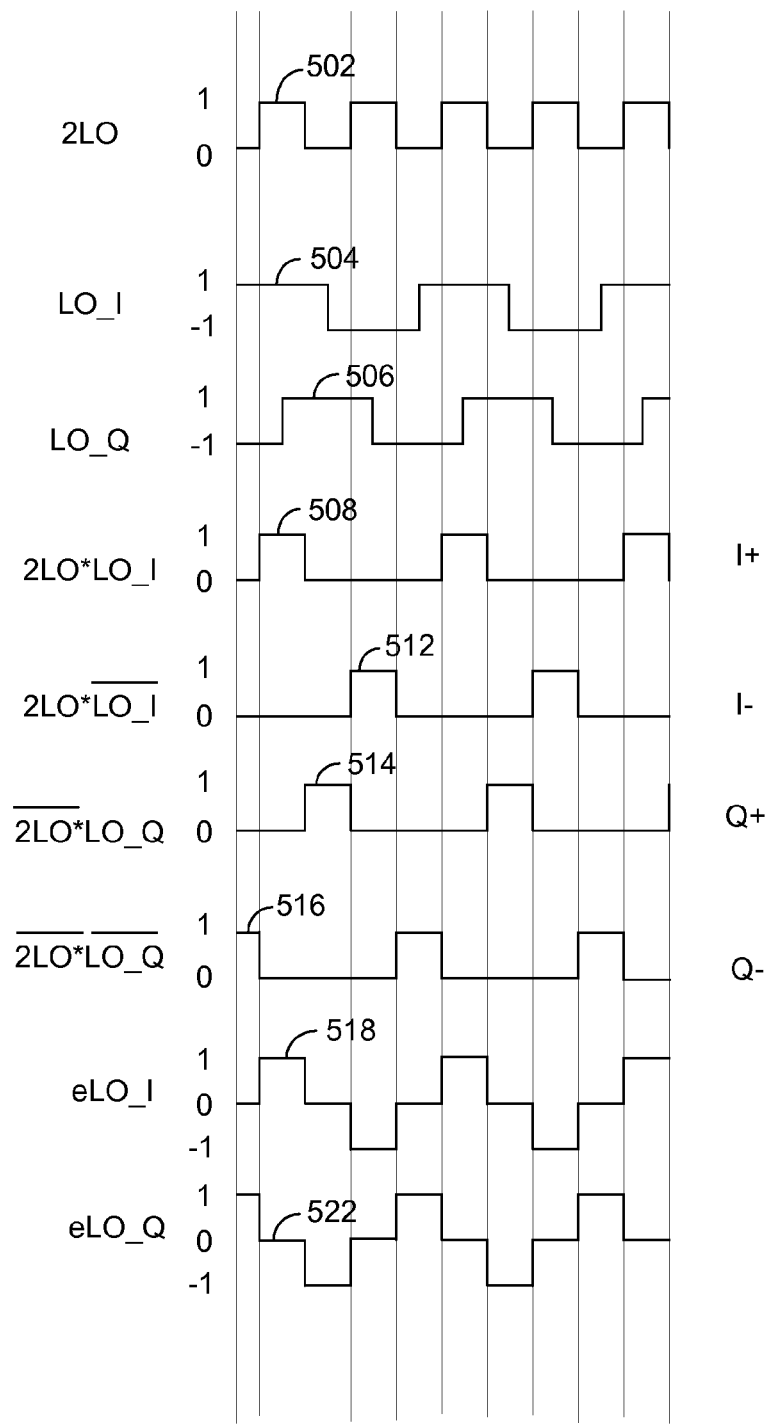
FIG. 5 is a graphical illustration showing the LO signals used in the embodiment of the passive mixer and filter using LO 2LO topology described in FIGS. 3 and 4.

As illustrated in the diagram of the effective LO signals shown in FIG. 5, at any given point in time, only one of the following connections is established. A connection between node 304 and node 334, a connection between node 304 and node 336, a connection between node 304 and node 344; or a connection between node 304 and node 346. The division in time is accomplished by switching the switches 310 and 320 using the signals 2LO and $\overline{2LO}$. In this manner, isolation between the I mixers 330/332 and trans-impedance amplifier 352; and the Q mixers 340/342 and trans-impedance amplifier 362 is achieved by splitting the signals in the time domain.

The isolation achieved between the trans-impedance amplifiers 352 and 362 increases the impedance appearing at the nodes 334/336 and nodes 344/346 looking into the passive mixers. The impedance is higher and is limited by the resistance of the tank circuit 306 at the resonant frequency. This high impedance reduces the transfer gain for the input referred noise of the trans-impedance amplifiers 352 and 362, thus improving the overall sensitivity of the receiver.

For a given current Iout at node 304, the current to voltage gain is given by the effective impedance Gain=(Vout/Iin)= $R_{tia}(2/\pi\sqrt{2})$ where $R_{tia}$ is the value of resistance 356. This gain is 3 dB higher than the gain that would be obtained if a pair of conventional I and Q mixers were connected to node 304.

Further mechanisms that contribute to lower mixer flicker noise, lower thermal noise, better IQ mismatch and higher IP2 have been described in co-pending U.S. patent application Ser. No. 11/220,030, filed on Sep. 6, 2005, entitled "Low Noise Mixer."

Figure 4:
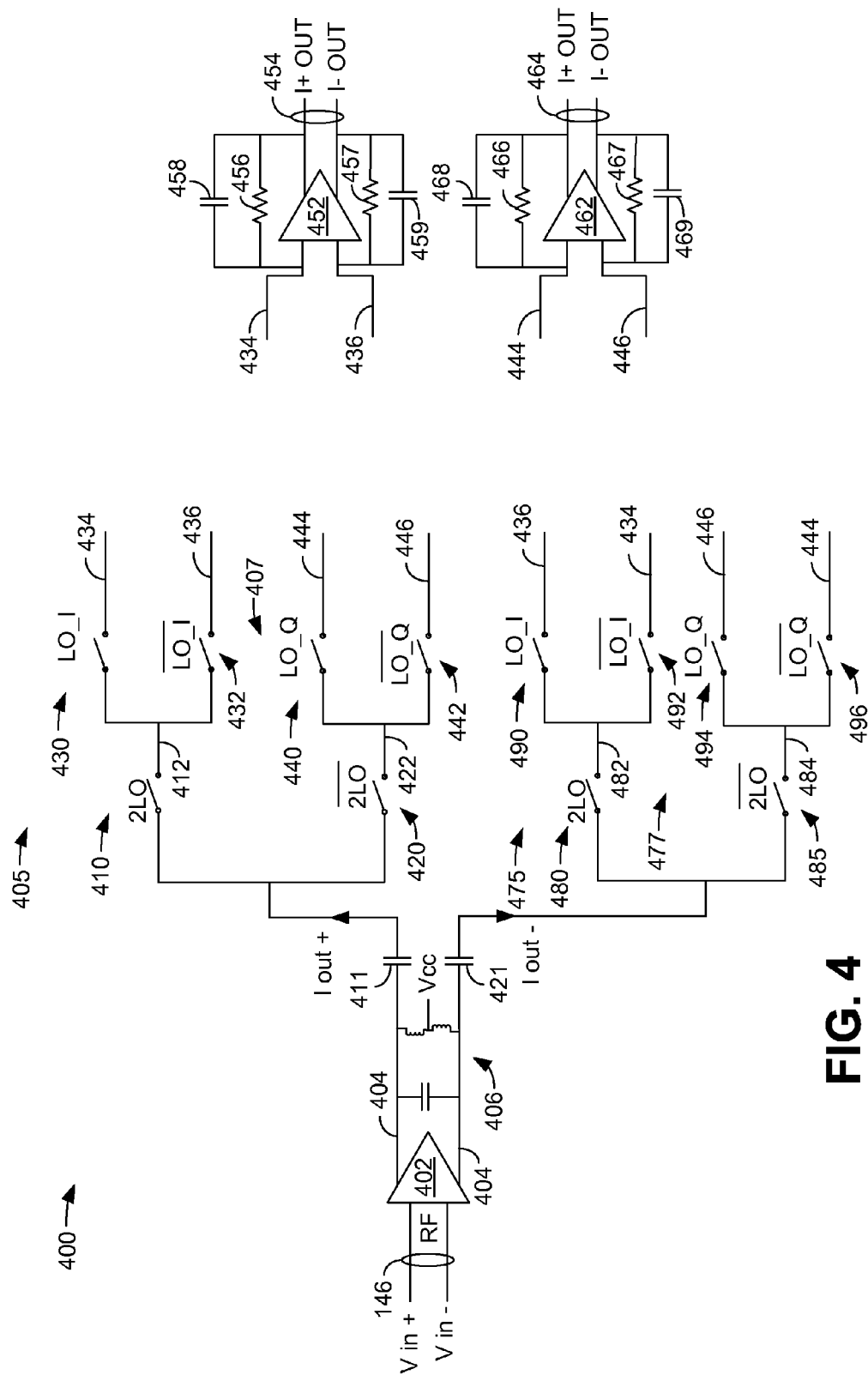
FIG. 4 is a schematic diagram illustrating an embodiment of a fully differential current-mode passive mixer implementing the LO 2LO topology.

FIG. 4 is a schematic diagram illustrating an embodiment of a fully differential current-mode passive mixer implementing the LO 2LO topology. Elements in FIG. 4 that are similar to elements in FIG. 3 are labeled using the nomenclature 4XX, where XX refers to the similar element in FIG. 3.

In the embodiment shown in FIG. 4, the mixer 400 operates in the current domain, and is fully differential at the RF input and at the baseband output. The output of the front end module 144 (FIG. 1) is received over connection 146. This is the input signal to the receiver 120 of FIG. 1. The input signal on connection 146 is a differential signal and is supplied to a low noise amplifier (LNA) 402. In an embodiment, the amplifier 402 can be a trans-impedance amplifier, otherwise known as a Gm stage. The input to the amplifier 402 on connection 146 is a differential voltage signal, Vin+ and Vin−, while the output of the amplifier 402 on connection 404 is a differential current signal, Iout+ and Iout−.

The current signal on connection 404 is provided to a tank circuit 406. The tank circuit 406 is similar to the tank circuit 306. The tank circuit 406 is tuned to the desired RF frequency so that it provides a high impedance connection to Vcc from node 404. This high impedance connection diverts the current from the output of the Gm stage to the passive mixer stages.

On the positive (Iout+) path, the mixer core includes an in-phase mixer core 405 and a quadrature-phase mixer core 407. The signal on connection 404 is provided to a pair of switches 410 and 420 through capacitance 411. The switch 410 is controlled by the 2LO signal and the switch 420 is controlled by the inverse of the 2LO signal, $\overline{2LO}$.

The output of the switch 410 is provided over connection 412 to switches 430 and 432. The switch 430 is controlled by the LO_I signal and the switch 432 is controlled by the $\overline{LO\_I}$ signal.

The output of the switch 420 is provided over connection 422 to switches 440 and 442. The switch 440 is controlled by the LO_Q signal and the switch 442 is controlled by the $\overline{LO\_Q}$ signal.

The output of the switch 430 is provided over connection 434 to an amplifier 452. Similarly, the output of the switch 432 is provided over connection 436 to the amplifier 452. The amplifier 452 can be, for example, a trans-impedance amplifier having a differential output on connection 454. The amplifier 452 is similar to the amplifier 352. The output on connection 454 is the differential in-phase (I) output signal.

The output of the switch 440 is provided over connection 444 to an amplifier 462. Similarly, the output of the switch 442 is provided over connection 446 to the amplifier 462. The amplifier 462 can be similar to the amplifier 452. The output on connection 464 is the differential quadrature-phase (Q) output signal.

On the negative (Iout−) path, the mixer core includes an in-phase mixer core 475 and a quadrature-phase mixer core 477. The signal on connection 404 is provided to a pair of switches 480 and 485 through capacitance 421. The switch 480 is controlled by the 2LO signal and the switch 485 is controlled by the inverse of the 2LO signal, $\overline{2LO}$.

The output of the switch 480 is provided over connection 482 to switches 490 and 492. The switch 490 is controlled by the LO_I signal and the switch 492 is controlled by the $\overline{LO\_I}$ signal.

The output of the switch 485 is provided over connection 484 to switches 494 and 496. The switch 494 is controlled by the LO_Q signal and the switch 496 is controlled by the $\overline{LO\_Q}$ signal.

The output of the switch 490 is provided over connection 436 to the amplifier 452. Similarly, the output of the switch 492 is provided over connection 434 to the amplifier 452. The amplifier 452 can be, for example, a trans-impedance amplifier having a differential output on connection 454. The amplifier 452 is similar to the amplifier 352. The output on connection 454 is the differential in-phase (I) output signal.

The output of the switch 494 is provided over connection 446 to the amplifier 462. Similarly, the output of the switch 496 is provided over connection 444 to the amplifier 462.

FIG. 5 is a graphical illustration showing the LO signals used in the embodiment of the passive mixer and filter using LO 2LO topology described in FIGS. 3 and 4. The in-phase LO signal includes differential components LO_I and $\overline{LO\_I}$. The quadrature-phase LO signal includes differential components LO_Q and $\overline{LO\_Q}$. The 2LO signal is an LO signal that occurs at twice the frequency of the I and Q LO signals. The inverse of the 2LO signal is referred to as $\overline{2LO}$.

The 2LO signal is shown at trace 502, the LO_I signal is shown at trace 504 and the LO_Q signal is shown at trace 506.

The 2LO*LO_I signal a shown at trace 508. The signal 508 represents the I+ signal. The 2LO*$\overline{LO\_I}$ signal is shown at trace 512. The signal 512 represents the I− signal. The $\overline{2LO}$*LO_Q signal is shown at trace 514. The signal 514 represents the Q+ signal. The $\overline{2LO}$*$\overline{LO\_Q}$ signal is shown at trace 516. The signal 516 represents the Q− signal.

The effective in-phase LO signal, eLO_I, is shown at 518 and the effective quadrature-phase LO signal, eLO_Q, is shown at 522. As shown in FIG. 5, the effective in-phase LO signal, eLO_I, 518 and the effective quadrature-phase LO signal, eLO_Q, 522 provide an approximate 25% duty cycle and ensure that switching takes place only on the transitions of the 2LO signal 502, thus minimizing any influence of switching noise, and minimizing any I and Q signal overlap due to the LO_I signal 504 and the LO_Q signal 506.

Figure 6:
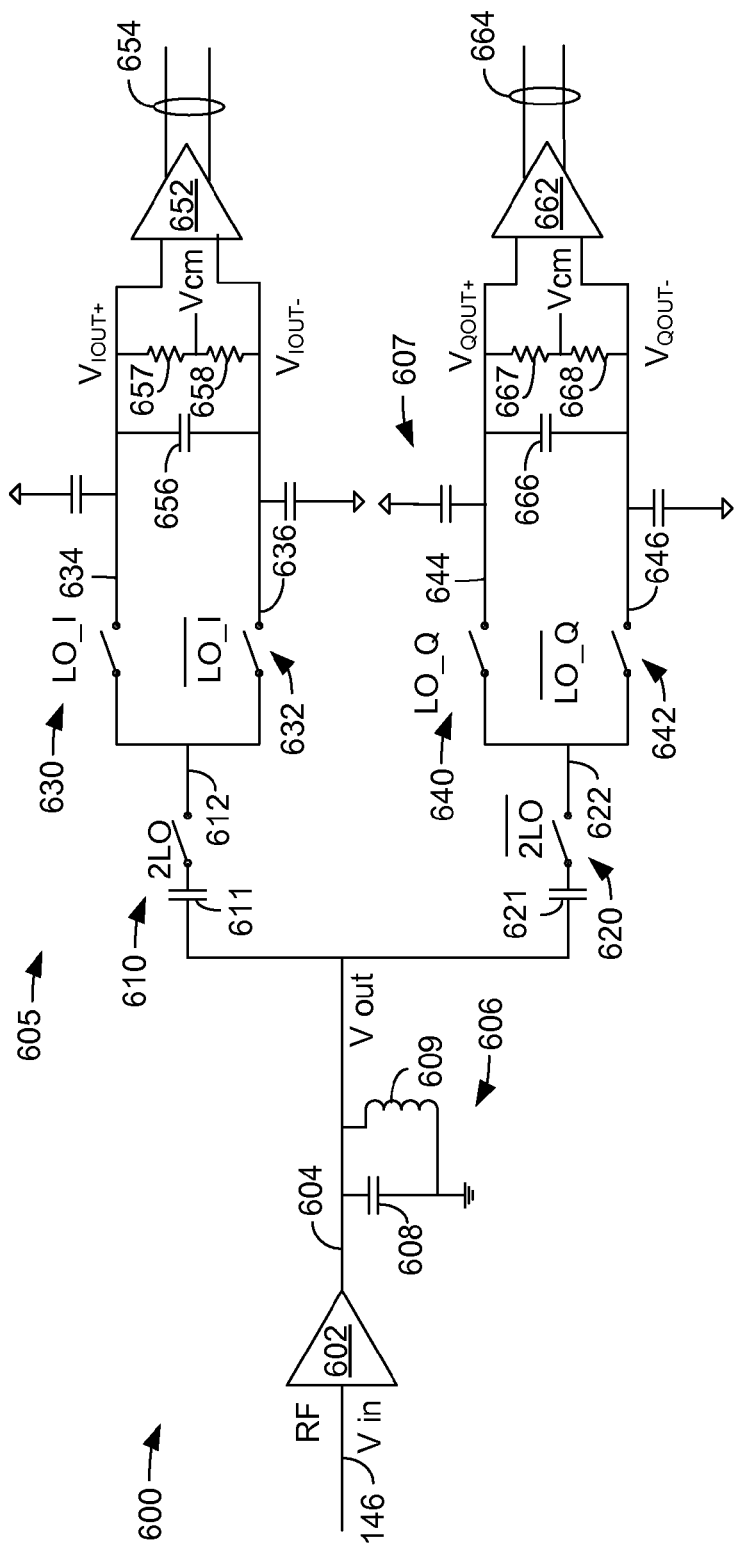
FIG. 6 is a schematic diagram illustrating an embodiment of a single-ended voltage-mode passive mixer implementing the LO 2LO topology.

FIG. 6 is a schematic diagram illustrating an embodiment of a single-ended voltage-mode passive mixer implementing the LO 2LO topology. In an embodiment, a voltage-mode passive mixer can be implemented using the LO 2LO passive mixer shown in FIG. 3 (and a fully-differential implementation such as in FIG. 4) by terminating the output of the switches 334, 336, 344, 346 (FIG. 3) with a capacitance, followed by a high impedance low noise baseband amplifier. Elements in FIG. 6 that are similar to elements in FIG. 3 are labeled using the nomenclature 6XX, where XX refers to the similar element in FIG. 3.

In the embodiment shown in FIG. 6, the mixer 600 operates in the voltage domain rather than in the current domain, and is single-ended at the RF input, but differential at the baseband output. The output of the front end module 144 (FIG. 1) is received over connection 146. This is the input signal to the receiver 120 of FIG. 1. The input signal on connection 146 is supplied to a low noise amplifier (LNA) 602. In an embodiment, the amplifier 602 can be a trans-admittance amplifier, otherwise known as a Gm stage. The output of the amplifier 602 on connection 604 is a voltage signal, Vout.

The voltage signal on connection 604 is provided to a tank circuit 606. The tank circuit 606 is similar to the tank circuit 306. The output of the tank circuit 606 on connection 604 is a voltage signal, referred to as Vout.

The mixer core includes an in-phase mixer core 605 and a quadrature-phase mixer core 607. The signal on connection 604 is provided to a pair of switches 610 and 620 through respective capacitances 611 and 621. The switch 610 is controlled by the 2LO signal and the switch 620 is controlled by the inverse of the 2LO signal, $\overline{2LO}$.

The output of the switch 610 is provided over connection 612 to switches 630 and 632. The switch 630 is controlled by the LO_I signal and the switch 632 is controlled by the $\overline{LO\_I}$ signal.

The output of the switch 620 is provided over connection 622 to switches 640 and 642. The switch 640 is controlled by the LO_Q signal and the switch 642 is controlled by the $\overline{LO\_Q}$ signal.

The output switches 630 and 632 on connections 634 and 636, respectively, are terminated by a capacitance 656, followed by the high impedance low noise baseband amplifier 652. The in-phase differential output $V_{Iout+}$ and $V_{Iout-}$ is provided over connections 634 and 636. Bias resistances 657 and 658 receive a voltage signal Vcm that sets the DC voltage on the switches 630 and 632. Bias resistances 657 and 658 are typically quite large, in the range of 0.5 Kohm to 20 kOhm.

The output switches 640 and 642 on connections 644 and 646, respectively, are terminated by a capacitance 666, followed by the high impedance low noise baseband amplifier 662. The quadrature differential output $V_{Qout+}$ and $V_{Qout-}$ is provided over connections 644 and 646. Bias resistances 667 and 668 receive a voltage signal Vcm that sets the DC voltage on the switches 640 and 642. Bias resistances 667 and 668 are typically quite large, in the range of 0.5 Kohm to 20 kOhm. As will be described below, voltage mode operation makes high Q filtering feasible using the approximate 25% duty cycle or LO-2LO architecture described herein.

Figure 7:
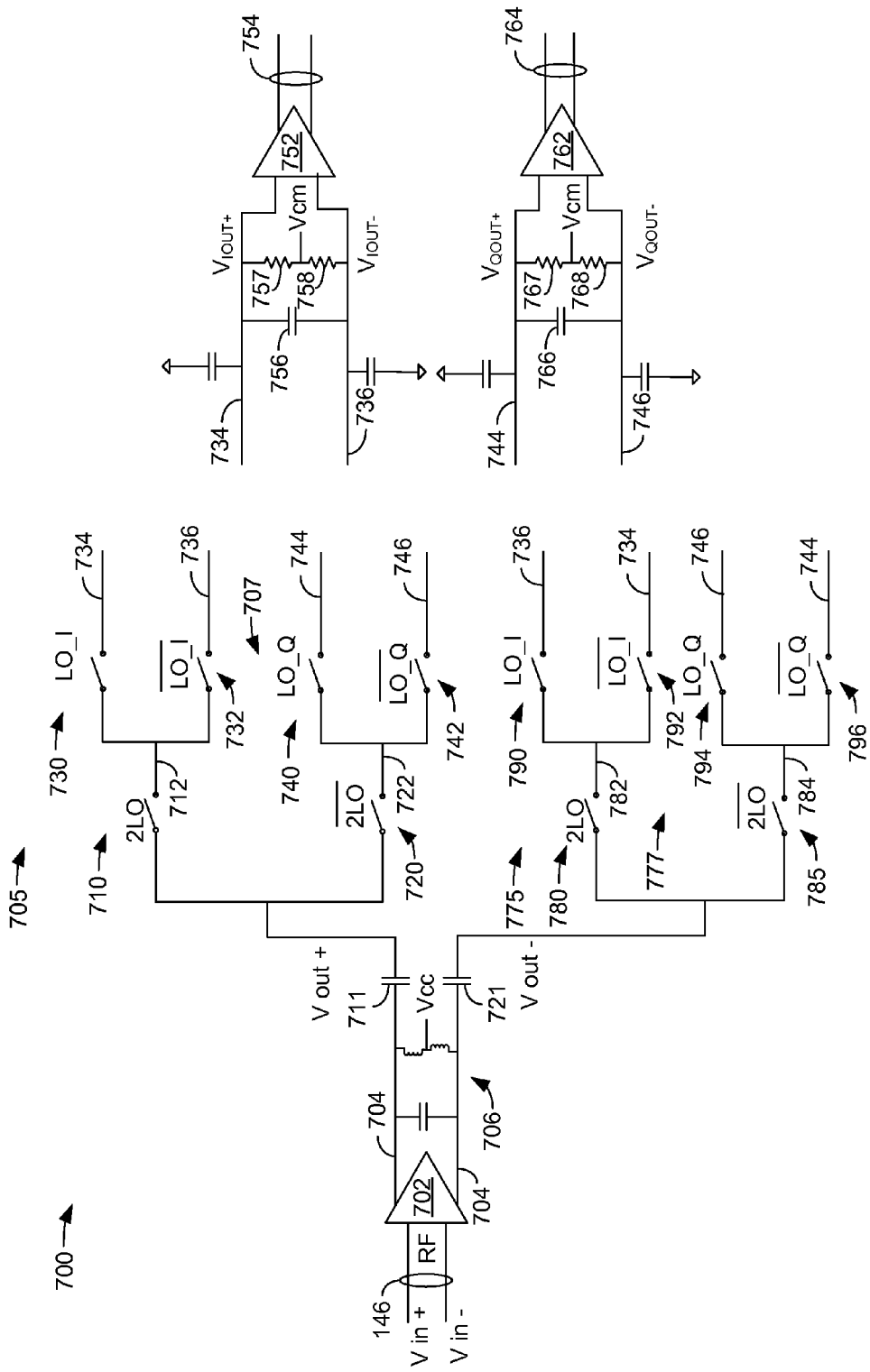
FIG. 7 is a schematic diagram illustrating an embodiment of a fully differential voltage-mode passive mixer implementing the LO 2LO topology.

FIG. 7 is a schematic diagram illustrating an embodiment of a fully differential voltage-mode passive mixer implementing the LO 2LO topology. Elements in FIG. 7 that are similar to elements in FIG. 6 are labeled using the nomenclature 7XX, where XX refers to the similar element in FIG. 6.

In the embodiment shown in FIG. 7, the mixer 700 operates in the voltage domain rather than in the current domain, and is fully differential at the RF input and at the baseband output. The output of the front end module 144 (FIG. 1) is received over connection 146. This is the input signal to the receiver 120 of FIG. 1. The input signal on connection 146 is a differential signal and is supplied to a low noise amplifier (LNA) 702. In an embodiment, the amplifier 702 can be a trans-admittance amplifier, otherwise known as a Gm stage. The input to the amplifier 702 on connection 146 is a differential voltage signal, Vin+ and Vin−. The output of the amplifier 702 on connection 704 is a differential voltage signal, Vout+ and Vout−.

The voltage signal on connection 704 is provided to a tank circuit 706. The tank circuit 706 is similar to the tank circuit 606.

On the positive (Vout+) path, the mixer core includes an in-phase mixer core 705 and a quadrature-phase mixer core 707. The signal on connection 704 is provided to a pair of switches 710 and 720 through capacitance 711. The switch 710 is controlled by the 2LO signal and the switch 720 is controlled by the inverse of the 2LO signal, $\overline{2LO}$.

The output of the switch 710 is provided over connection 712 to switches 730 and 732. The switch 730 is controlled by the LO_I signal and the switch 732 is controlled by the $\overline{LO\_I}$ signal.

The output of the switch 720 is provided over connection 722 to switches 740 and 742. The switch 740 is controlled by the LO_Q signal and the switch 742 is controlled by the $\overline{LO\_Q}$ signal.

The output switches 730 and 732 on connections 734 and 736, respectively, are terminated by a capacitance 756, followed by the high impedance low noise baseband amplifier 752. The in-phase differential output $V_{Iout+}$ and $V_{Iout-}$ is provided over connections 734 and 736. Bias resistances 757 and 758 receive a voltage signal Vcm.

The output switches 740 and 742 on connections 744 and 746, respectively, are terminated by a capacitance 766, followed by the high impedance low noise baseband amplifier 762. The quadrature differential output $V_{Qout+}$ and $V_{Qout-}$ is provided over connections 744 and 746. Bias resistances 767 and 768 receive a voltage signal Vcm. As will be described below, voltage mode operation makes high Q filtering feasible using the approximate 25% duty cycle or LO-2LO architecture described herein.

On the negative (Vout−) path, the mixer core includes an in-phase mixer core 775 and a quadrature-phase mixer core 777. The signal on connection 704 is provided to a pair of switches 780 and 785 through capacitance 721. The switch 780 is controlled by the 2LO signal and the switch 785 is controlled by the inverse of the 2LO signal, $\overline{2LO}$.

The output of the switch 780 is provided over connection 782 to switches 790 and 792. The switch 790 is controlled by the LO_I signal and the switch 792 is controlled by the $\overline{\text{LO\_I}}$ signal.

The output of the switch 785 is provided over connection 784 to switches 794 and 796. The switch 794 is controlled by the LO_Q signal and the switch 796 is controlled by the $\overline{\text{LO\_Q}}$ signal.

The output switches 790 and 792 on connections 736 and 734, respectively, are terminated by a capacitance 756, followed by the high impedance low noise baseband amplifier 752. The in-phase differential output $V_{Iout+}$ and $V_{Iout-}$ is provided over connections 734 and 736.

The output switches 794 and 796 on connections 746 and 744, respectively, are terminated by a capacitance 766, followed by the high impedance low noise baseband amplifier 762. The quadrature differential output $V_{Qout+}$ and $V_{Qout-}$ is provided over connections 744 and 746.

It should be mentioned that there are differences in gain between the current-mode implementation (FIGS. 3 and 4) and voltage-mode implementation (FIGS. 6 and 7). In current mode the gain is similar to an active LO 2LO mixer as discussed above. In voltage-mode, the voltage gain from the LNA output node to the differential mixer output nodes is approximately 6 dB for a single-ended implementation (FIG. 6), while it is close to 0 dB for a differential implementation (FIG. 7). The mixer implementation shown in FIGS. 6 and 7 can be viewed as a series of sample and hold (S/H) functions where the voltage gain from RF input to sampled output of each switch approaches 0 dB as the duration of the on time of the mixer switches approaches zero (train of impulses). As the width of the on-time of the switches (or duty cycle) increases, the gain drops. For all practical purposes the gain for a 25% duty cycle, which is slightly lower than 0 dB, can be approximated to 0 dB.

Figure 8:
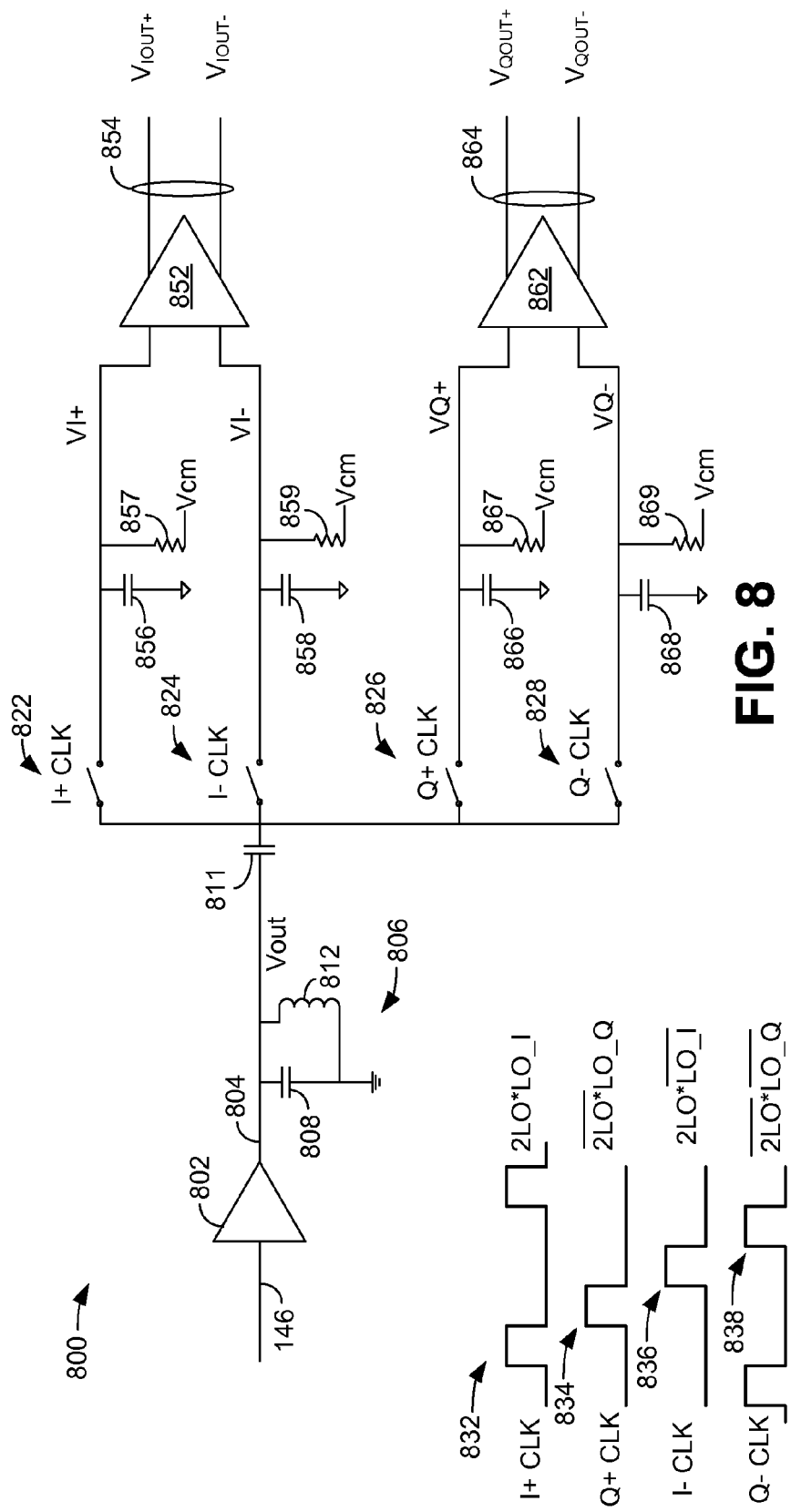
FIG. 8 is a simplified schematic diagram of an alternative embodiment of a single-ended voltage-mode passive mixer implemented using the approximate 25% duty cycle topology described herein.

FIG. 8 is a simplified schematic diagram of an alternative embodiment of a single-ended voltage-mode passive mixer implemented using the approximate 25% duty cycle topology described herein. Although voltage mode operation is illustrated in the embodiment shown in FIG. 8, a current mode implementation can also be used. FIG. 8 illustrates a difference between implementing the approximate 25% duty cycle and the LO 2LO architecture described herein. By recognizing that the LO 2LO topology essentially connects the RF input (i.e., node 304 of FIG. 3) to each of the baseband outputs (i.e., nodes 334, 336, 344 and 346 of FIG. 3) for ¼ of the time or 25% duty cycle of LO frequency, circuit implementations can be provided where the 25% duty cycle LO signals are generated in the LO chain rather than the RF signal path. In practice less than 25% duty cycle might be desirable to prevent overlap between the on-times of the switches, ensuring good noise performance in both receive or transmit mixers implementations. However, in current mode mixer implementations a smaller duty cycle (less than 25%) can quickly degrade the linearity while yielding only marginal improvements in noise.

In a voltage mode mixer implementation, such as shown in FIG. 8, reducing the duty cycle to 20% or below is possible, but it also quickly reaches the point of diminishing returns where noise contributions due to aliasing of undesired input signals or noise around harmonics of LO frequency degrade performance. Duty cycle between 20-25% is chosen in this implementation.

In the topology shown in FIG. 8, the LO 2LO multiplication is done in the LO path rather than the RF path. The signal propagation through the passive mixer 800 is therefore simplified as the RF signal now propagates through one switching device rather than a series of two, as described in FIGS. 3, 4, 6 and 7. The architecture shown in FIG. 8, although marginally better than the topology shown in FIGS. 3, 4, 6 and 7 for linearity and noise of the switches, is worse for I-Q mismatch and LO phase noise. The LO circuitry is also more complicated and consumes more power. In spite of these drawbacks, the simplicity of the signal path offers significant advantages, especially when a voltage mode mixer topology is used. Further, as will be described below, the filtering properties of the passive mixer topology shown in FIG. 8 are more effective with the lower series resistance of one switch for each quadrature I and Q signal as shown in FIG. 8 (rather than two) giving rise to a higher Q filtering response in the RF path.

The passive mixer 800 illustrates an embodiment of the approximate 25% duty cycle mixer topology in voltage mode. The output of a low noise amplifier is received over connection 146. This is the input signal to the receiver 120 of FIG. 1. The input signal on connection 146 is supplied to an amplifier 802. In an embodiment, the amplifier 802 can be a transadmittance amplifier, otherwise known as a Gm stage. The output of the amplifier 802 on connection 804 is a voltage signal.

The voltage signal on connection 804 is provided to a tank circuit 806. The tank circuit 806 is similar to the tank circuit 306 described above. The output of the tank circuit 806 on connection 804 is a voltage signal, referred to as Vout.

The voltage signal on connection 804 is provided through a capacitance 811 to switches 822, 824, 826 and 828. The switches 822, 824, 826 and 828 can be implemented using any switch technology such as, for example, bipolar junction transistor (BJT) technology, field effect transistor (FET) technology, or any other switching technology. The switches 822, 824, 826 and 828 can also be replaced by pass gates, which are typically a combination of an NFET and PFET transistor, as known in the art. The switches 822, 824, 826 and 828 are illustrated in FIG. 8 as simple single-pole single-throw switches to illustrate that any types of switches can be used to generate the switching signals described herein.

In the embodiment described herein, the in-phase (I) and quadrature-phase (Q) signals are differential. Therefore, the I signal includes a $V_{I+}$ signal and a $V_{I-}$ signal. Similarly, the Q signal includes a $V_{Q+}$ signal and a $V_{Q-}$ signal. The switch 822 generates the I+ signal, the switch 824 generates the I− signal, the switch 826 generates the Q+ signal and the switch 828 generates the Q− signal. The clock signals that drive the switches 822, 824, 826 and 828 are illustrated as having a 25% duty cycle and can be generated as will be described below. The clock signal 832 drives the switch 822, the clock signal 834 drives the switch 826, the clock signal 836 drives the switch 824 and the clock signal 838 drives the switch 828. In accordance with an embodiment of the passive mixer using an approximate 25% duty cycle topology, none of the clock signals 832 through 838 have any time period during which they overlap, or are positive at the same time.

The output of the switch 822 is terminated by a capacitance 856 and a resistance 857, and is provided to one input of the amplifier 852. The output of the switch 824 is terminated by a capacitance 858 and a resistance 859, and is provided to the other input of the amplifier 852. The output of the switch 826 is terminated by a capacitance 866 and a resistance 867, and is provided to one input of the amplifier 862. The output of the switch 828 is terminated by a capacitance 868 and a resistance 869, and is provided to the other input of the amplifier 862. The output of the amplifier 852 on connection 854 is the differential $V_{I+}$ and $V_{I-}$ output signal; and the output of the amplifier 862 on connection 864 is the differential $V_{Q+}$ and $V_{Q-}$ output signal.

Figure 9:
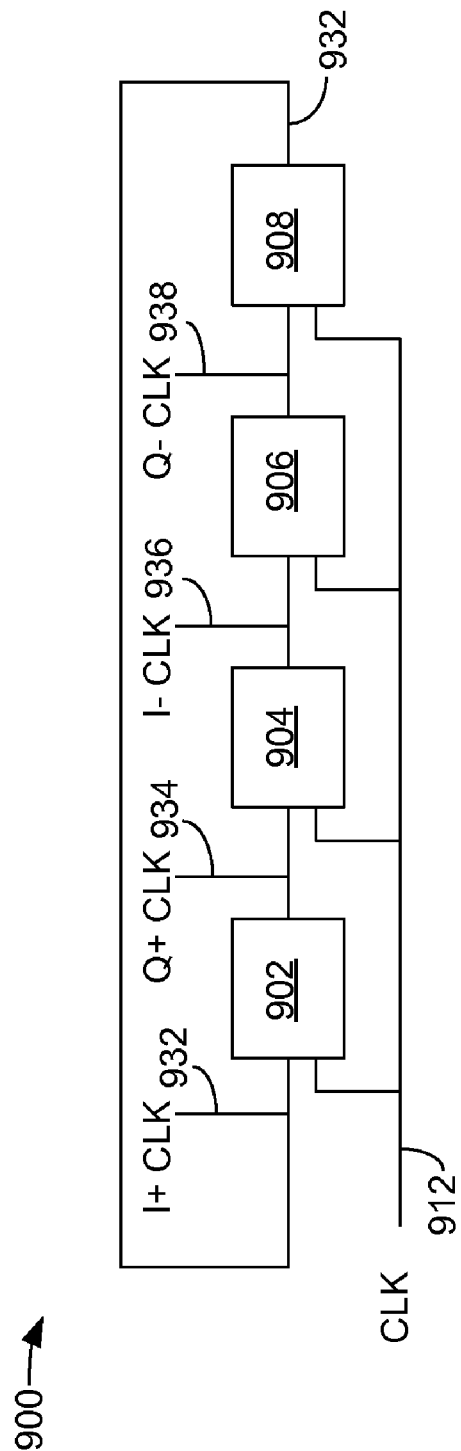
FIG. 9 is a schematic diagram illustrating an alternative embodiment of a circuit that can be used to generate the clock signals described in FIG. 8.

FIG. 9 is a schematic diagram illustrating an alternative embodiment of a circuit that can be used to generate the clock signals described in FIG. 8. FIG. 9 illustrates a ripple counter 900 that includes flip flops 902, 904, 906 and 908. A clock signal, CLK, is supplied on connection 912 to the flip flops. In an embodiment, the clock signal on connection 912 operates at four times the LO frequency (4LO). The output of the flip flop 908 on connection 932 is the I+CLK signal, the output of the flip flop 902 on connection 934 represents the Q+CLK signal, the output of the flip flop 904 on connection 936 represents the I−CLK signal and the output of the flip flop 906 on connection 938 represents the Q−CLK signal. The counter 900 should be initialized to state 1000 by setting or resetting the flip flops.

Figure 10:
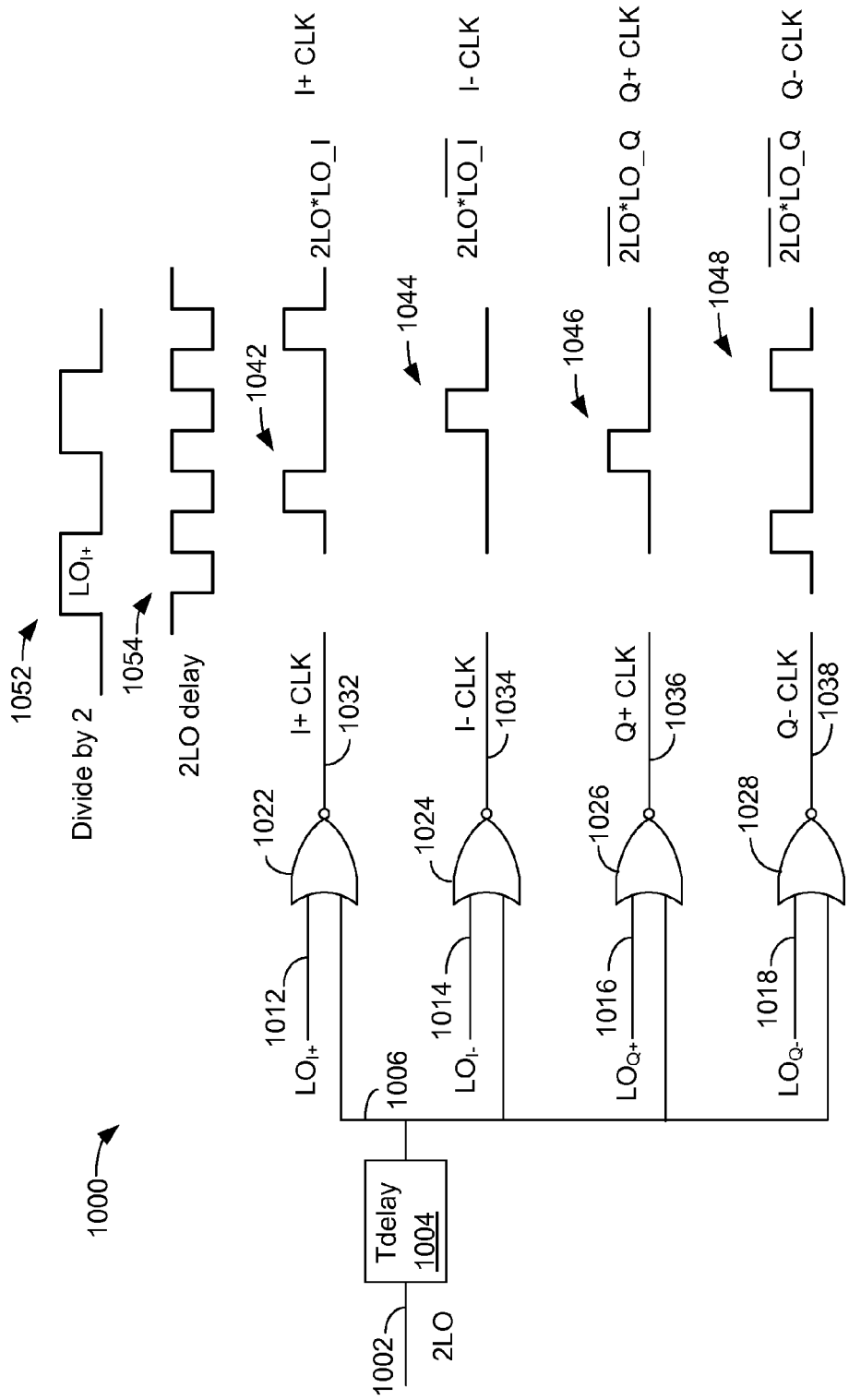
FIG. 10 is a schematic diagram illustrating another alternative embodiment of a circuit that can be used to generate the clock signals described in FIG. 8.

FIG. 10 is a schematic diagram illustrating another alternative embodiment of a circuit 1000 that can be used to generate the clock signals described in FIG. 8. The circuit 1000 illustrates the manner in which the approximate 25% duty cycle can be generated for the architecture shown in FIG. 8. The circuit 1000 illustrates a CMOS divider which creates LO signals for the mixer of FIG. 8 that are relatively insensitive to divide by 2 noise while minimizing LO I-Q phase and amplitude mismatches.

The circuit 1000 includes NOR gates 1022, 1024, 1026 and 1028. Each of the NOR gates receives a delayed version of the 2LO signal from delay element 1004 over connection 1006. The delay provided by the delay element 1004 is chosen so that transitions in the two signals on the NOR gate inputs do not occur at the same time. Once this condition is satisfied, the signals at the NOR gate outputs are dependent on the 2LO signal rather than the LO signals from the divider (FIG. 2). The NOR gate 1022 receives the LOI+ signal over connection 1012, the NOR gate 1024 receives the LOI− signal over connection 1014, the NOR gate 1026 receives the LOQ+ signal over connection 1016 and the NOR gate 1028 receives the LOQ− signal over connection 1018.

The NOR gate 1022 provides the I+ clock signal over connection 1032, the NOR gate 1024 provides the I− clock signal over connection 1034, the NOR gate 1026 provides the Q+ clock signal over connection 1036 and the NOR gate 1028 provides the Q− clock signal over connection 1038.

The 2LO*LO_I signal is shown at trace 1042. The signal 1042 represents the I+clock signal. The 2LO*$\overline{\text{LO\_I}}$ signal is shown at trace 1044. The signal 1044 represents the I−clock signal. The $\overline{\text{2LO}}$*LO_Q signal is shown at trace 1046. The signal 1046 represents the Q+clock signal. The $\overline{\text{2LO}}$*$\overline{\text{LO\_Q}}$ signal is shown at trace 1048. The signal 1048 represents the Q− clock signal.

The signal trace 1052 represents the signal on connection 1012 and illustrates the divide by two function for the LOI+ signal and the signal trace 1054 illustrates the signal on connection 1006 and illustrates the delayed version of the 2LO signal that is provided by the delay element 1004.

Figure 11A:
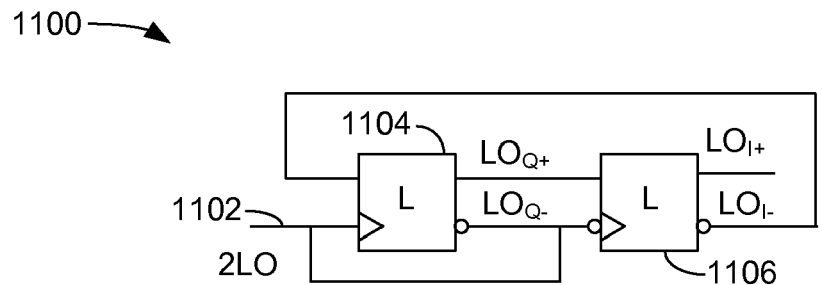
FIG. 11A is another alternative embodiment of a circuit that can be used to generate the clock signals described in FIG. 8.

FIG. 11A is an embodiment of a circuit 1100 that can be used to generate the signals on connections 1012, 1014, 1016, 1018 described in FIG. 10. The circuit 1100 is a latch circuit having latch elements 1104 and 1106. A clock signal at a frequency that is twice the LO frequency (2LO) is provided over connection 1102. The latch element 1104 generates the LOQ+ and the LOQ− signals and the latch element 1106 generates the LOI+ and LOI− signals of connections 1012, 1014, 1016 and 1018 of FIG. 10.

Figure 11B:
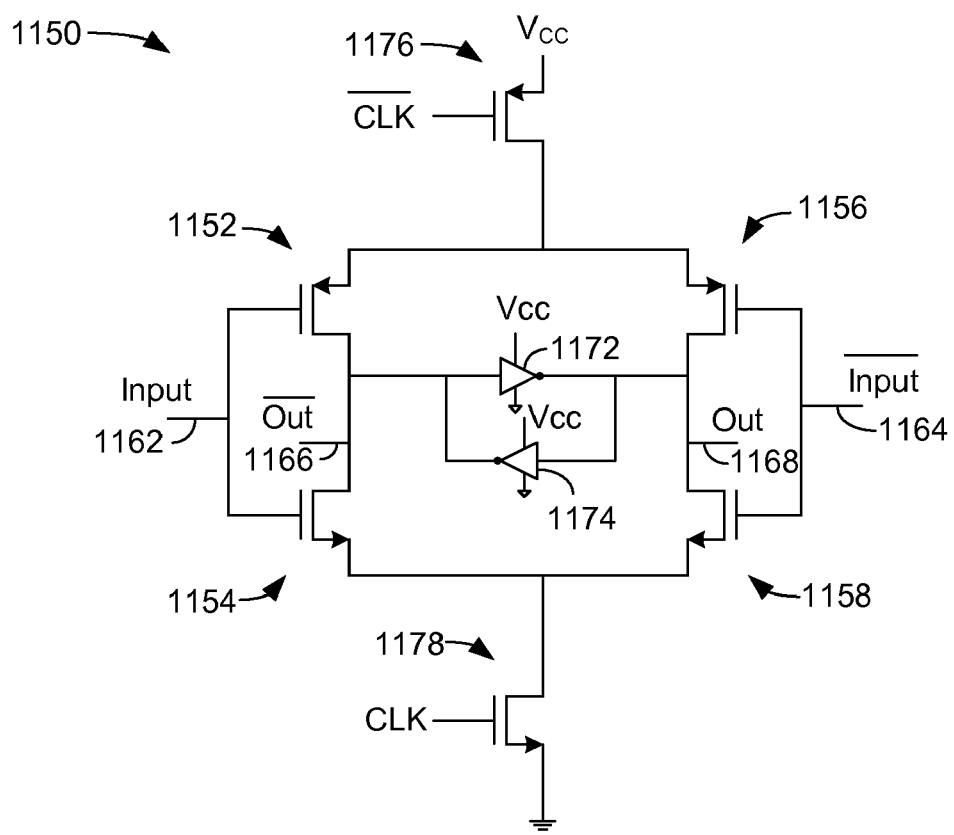
FIG. 11B is a schematic diagram illustrating an embodiment of the latch circuit of FIG. 11A.

FIG. 11B is a schematic diagram illustrating an embodiment of the latch circuit of FIG. 11A. The circuit 1150 includes switch elements 1152, 1154, 1156, 1158, 1176 and 1178. In this example, the switch elements are depicted as field effect transistor (FET) devices; however, other implementations are possible.

The switch elements 1152 and 1154 receive the input signal, Input, over connection 1162 and the switch elements 1156 and 1158 receive the inverse of the input signal, $\overline{\text{Input}}$, over connection 1164. The switch elements 1178 receives the clock signal, CLK, and the switch element 1176 receives the inverse of the clock input signal, $\overline{\text{CLK}}$.

The buffers 1172 and 1174 provide positive feedback on the latch. The output of the circuit 1150 is obtained at connections 1166 and 1168.

Figure 12:
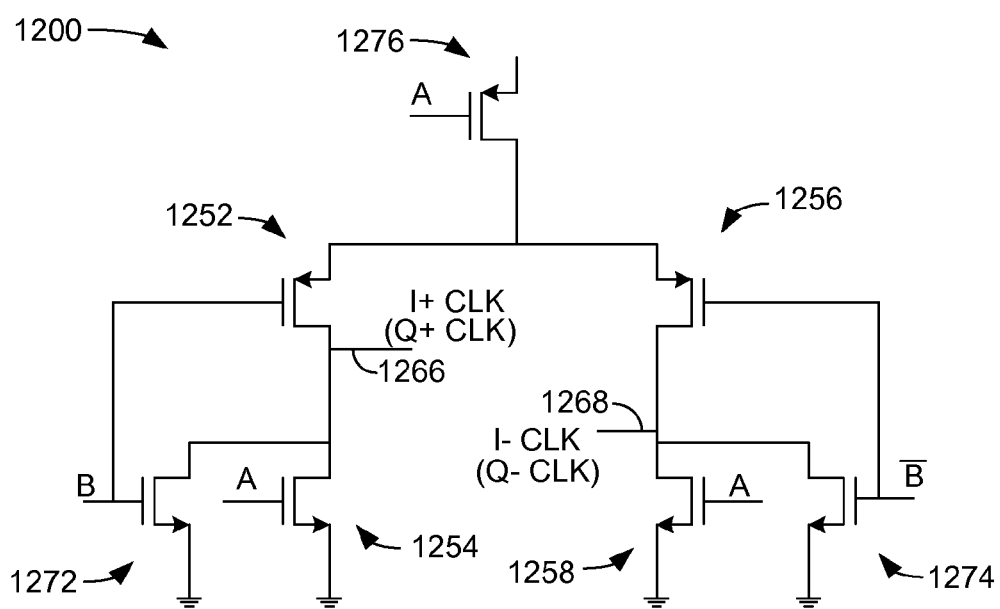
FIG. 12 is a schematic diagram illustrating an example implementation of one pair of the NOR gates of FIG. 10.

FIG. 12 is a schematic diagram illustrating an example implementation of one pair of the NOR gates of FIG. 10. In this example, the switch elements are depicted as field effect transistor (FET) devices; however, other implementations are possible.

The switch element 1254 and 1258 receive the input signal, A, and the switch elements 1252 and 1272, receive input signal B, while switch elements 1256 and 1274 receive an inverted version of the input signal $\overline{\text{B}}$. The switch element 1276 also receives the input signal A. Referring briefly to FIG. 10, this implementation, for example, combines NOR gates 1022 and 1024. Input A of FIG. 12 would be connected to connection 1006 of FIG. 10. Input B of FIG. 12 would be connected to 1012 of FIG. 10. The inverted signal $\overline{\text{B}}$ of FIG. 12 would be connected to connection 1014 of FIG. 10.

The I+CLK (or the Q+CLK) output of the circuit 1200 is obtained at connection 1266 and the I−CLK (or the Q−CLK) output is obtained at connection 1268. The circuit 1200 is referred to as a "pseudo-differential" implementation. The implementation shown in FIG. 12, where the transistor 1276 is shared between the two NOR gates reduces the load on input A, while improving the phase noise of the differential output signals.

Figure 13:
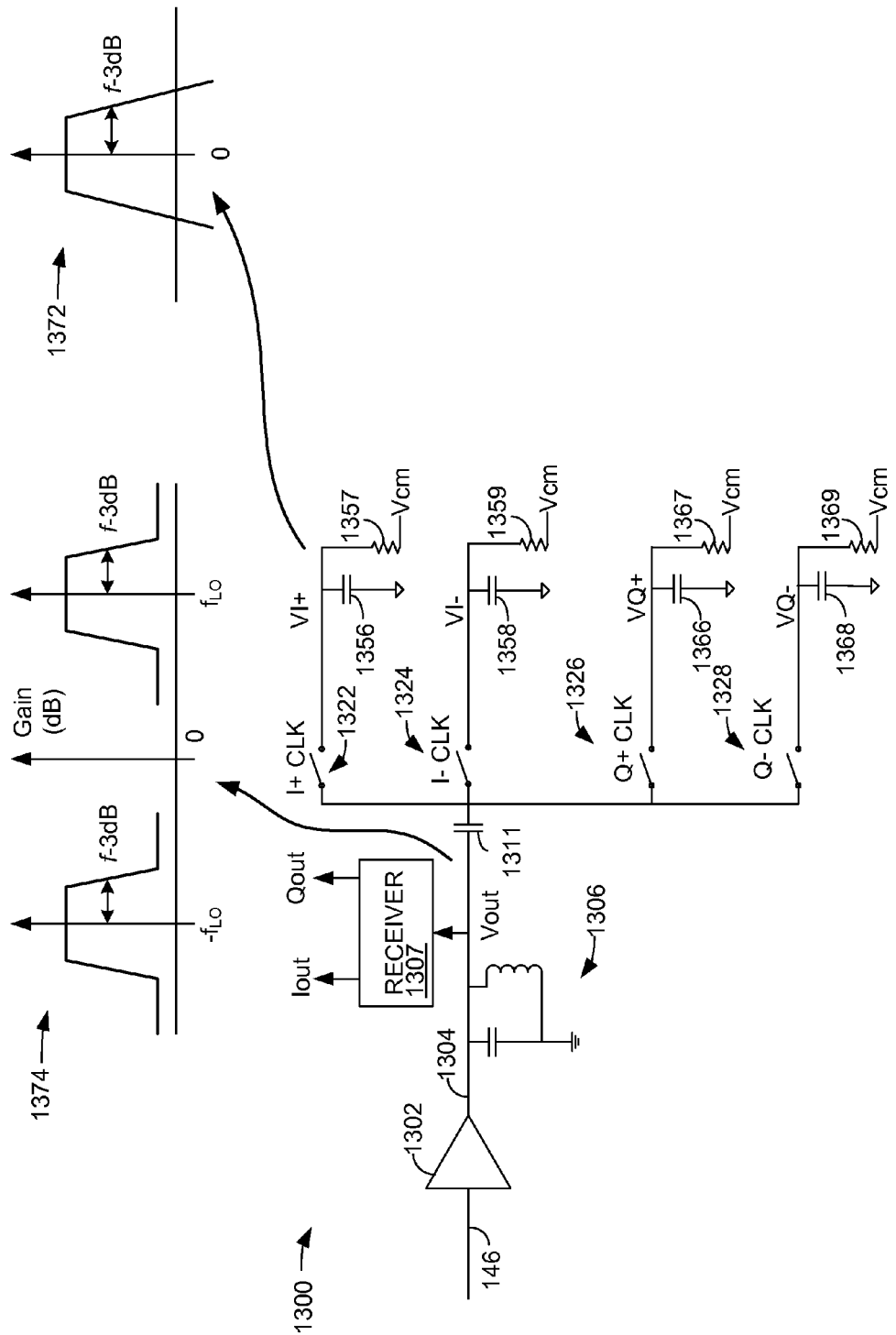
FIG. 13 a schematic diagram illustrating an embodiment of a filter implemented using the approximate 25% duty cycle topology.

FIG. 13 a schematic diagram illustrating an embodiment of a filter implemented using the approximate 25% duty cycle topology. The embodiment shown in FIG. 13 illustrates the general concept of filtering using the approximate 25% duty cycle topology.

Typical filters implemented at RF using on-chip elements achieve Q factors generally less than 25. Filtering a blocking signal at 20 MHz offset frequency in a 900 Mhz receiver typically demands a filter Q>300. FIG. 13 illustrates a general implementation of a high Q filter 1300 using the approximate 25% duty cycle topology. When the LO signals are available, low frequency filters (at baseband frequency) can be translated to the LO frequency. A value of Q in excess of 500 can be routinely achieved. In general, these filters are implemented in voltage-mode where the output of the passive mixer switch is a voltage rather than a current. While a conventional passive mixer based design can also be used to translate filter responses from DC to the LO frequency, the Q obtained in the approximate 25% duty cycle or LO-2LO approach are significantly higher. Such high Q responses are a result of the isolation between I and Q of the passive mixers in this topology. The implementations shown in FIG. 6, FIG. 7 and in FIG. 8 can be used to provide a high Q filter at the output of the LNA. The single switch RF path implementation shown in FIG. 8 provides higher filter Q and lower noise due to the lower resistance between the input RF and baseband output during the period in which the switches are on.

The passive mixer 1300 illustrates an embodiment of a high Q filter. The input signal on connection 146 is supplied to an amplifier 1302. In an embodiment, the amplifier 1302 can be a trans-admittance amplifier, otherwise known as a Gm stage. The output of the amplifier 1302 on connection 1304 is a voltage signal.

The voltage signal on connection 1304 is provided to a tank circuit 1306. The tank circuit 1306 is similar to the tank circuit 306 described above. The output of the tank circuit 1306 on connection 1304 is a voltage signal, referred to as Vout. The signal on connection 1304 is provided to a receiver 1307, which can provide the I and Q output signals, regardless of the receiver implementation.

The voltage signal on connection 1304 is provided through a capacitance 1311 to switches 1322, 1324, 1326 and 1328. The switches 1322, 1324, 1326 and 1328 can be implemented using any switch technology such as, for example, bipolar junction transistor (BJT) technology, field effect transistor (FET) technology, an NFET, PFET combination which is also called a pass gate, or any other switching technology. The switches 1322, 1324, 1326 and 1328 are illustrated in FIG. 13 as simple single-pole single-throw switches to illustrate that any types of switches can be used to generate the switching signals described herein.

In the embodiment described herein, the in-phase (I) and quadrature-phase (Q) signals are differential. Therefore, the I signal includes an $V_{I+}$ signal and an $V_{I-}$ signal. Similarly, the Q signal includes a $V_{Q+}$ signal and a $V_{Q-}$ signal. The switch 1322 generates the I+ signal, the switch 1324 generates the I− signal, the switch 1326 generates the Q+ signal and the switch 1328 generates the Q− signal. The clock signals that drive the switches 1322, 1324, 1326 and 1328 are similar to the clock signals described in FIG. 8.

The output of the switch 1322 is terminated by a capacitance 1356 and a resistance 1357. The output of the switch 1324 is terminated by a capacitance 1358 and a resistance 1359. The output of the switch 1326 is terminated by a capacitance 1366 and a resistance 1367. The output of the switch 1328 is terminated by a capacitance 1368 and a resistance 1369.

In accordance with the filter 1300, a low pass response having a 3 dB corner frequency at the output of the switch 1322 (and also the switches 1324, 1326 and 1328) as illustrated using graph 1372 is translated to the LO frequency on connection 1304 as illustrated by the graph 1374. The response is translated to +fLO. For simplicity, the 3LO, 5LO, 7LO, and other harmonics are omitted for ease of illustration.

The connection 1304 at the output of the LNA 1302 is a high-Q filtered voltage where the blocker has been attenuated. Typical attenuation in the range of 10-20 dB for 20 MHz and higher frequency blockers is possible in advanced CMOS technologies. The rejection is limited by the impedance of the tank circuit 1306 at resonance ($R_T$) and the series resistance of the switches used in the passive mixers.

The output of the circuit on connection 1304 is then supplied to the rest of the receiver chain, which could be implemented without any limitations.

The 3 dB corner frequency, "$f_{-3dB}$" is calculated according to:

$$f_{-3dB} = \frac{1}{2\pi \left(\frac{TLO}{TON}\right)} \frac{1}{R_T * C}$$

where $R_T$ is the impedance ($Z_T$) of the tank circuit 1306 at the resonant frequency, which in this embodiment is the LO frequency, $T_{LO}=1/f_{LO}$, the time period of the LO signal, and $T_{ON}$ is the period during which each switch is on and C is the value of capacitance 1356 of FIG. 13.

Figure 14:
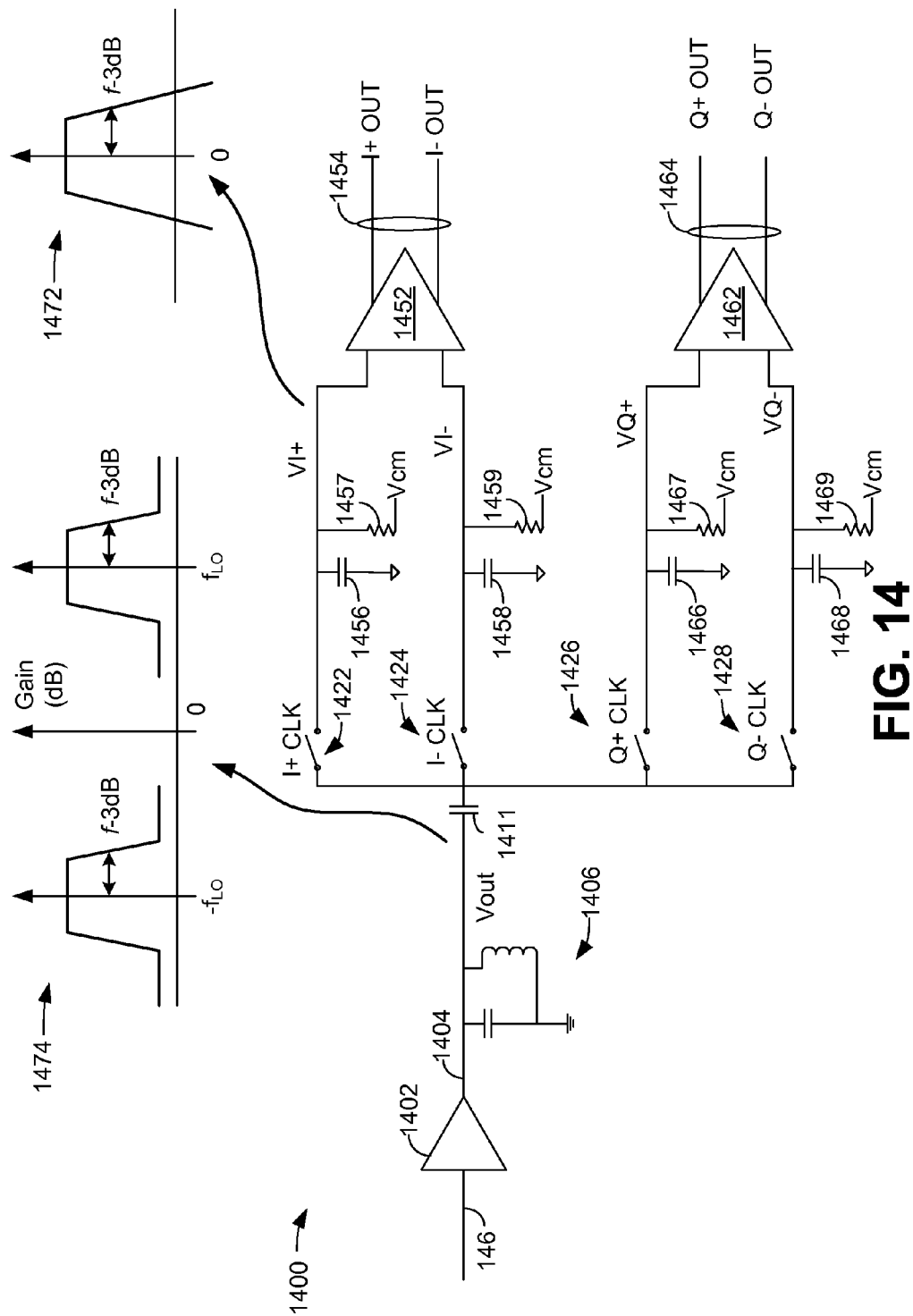
FIG. 14 a schematic diagram illustrating an alternative embodiment of a filter implemented using the approximate 25% duty cycle topology.

FIG. 14 a schematic diagram illustrating an embodiment of a receiver chain that uses the outputs of a filter implemented using the approximate 25% duty cycle topology for the I and Q received signals. Elements in FIG. 14 that are similar to elements in FIG. 13 are labeled using the nomenclature 14XX, where XX refers to the similar element in FIG. 13. While the implementation in FIG. 14 shows a single ended implementation, the filter architecture could be easily converted to a fully differential implementation.

The input signal on connection 146 is supplied to an amplifier 1402. In an embodiment, the amplifier 1402 can be a trans-admittance amplifier, otherwise known as a Gm stage. The output of the amplifier 1402 on connection 1404 is a voltage signal.

The voltage signal on connection 1404 is provided to a tank circuit 1406. The tank circuit 1406 is similar to the tank circuit 1306 described above. The output of the tank circuit 1406 on connection 1404 is a voltage signal, referred to as Vout.

The voltage signal on connection 1404 is provided through a capacitance 1411 to switches 1422, 1424, 1426 and 1428. The switches 1422, 1424, 1426 and 1428 can be implemented using any switch technology such as, for example, bipolar junction transistor (BJT) technology, field effect transistor (FET) technology, or any other switching technology. The switches 1422, 1424, 1426 and 1428 are illustrated in FIG. 14 as simple single-pole single-throw switches to illustrate that any types of switches can be used to generate the switching signals described herein.

In the embodiment described herein, the in-phase (I) and quadrature-phase (Q) signals are differential. Therefore, the I signal includes an $V_{I+}$ signal and an $V_{I-}$ signal. Similarly, the Q signal includes a $V_{Q+}$ signal and a $V_{Q-}$ signal. The switch 1422 generates the I+ signal, the switch 1424 generates the I− signal, the switch 1426 generates the Q+ signal and the switch 1428 generates the Q− signal. The clock signals that drive the switches 1422, 1424, 1426 and 1428 are similar to the clock signals described in FIG. 8.

The output of the switch 1422 is terminated by a capacitance 1456 and a resistance 1457 and is provided to an input of an amplifier 1452. The output of the switch 1424 is terminated by a capacitance 1458 and a resistance 1459 and is provided to another input of the amplifier 1452. The output of the switch 1426 is terminated by a capacitance 1466 and a resistance 1467 and is provided to an input of an amplifier 1462. The output of the switch 1428 is terminated by a capacitance 1468 and a resistance 1469 and is provided to another input of the amplifier 1462. The amplifiers 1452 and 1462 can be a trans-admittance amplifier or a Gm stage. The amplifier 1452 provides the differential I+out and the I−out signals over connection 1454. The amplifier 1462 provides the differential Q+out and the Q−out signals over connection 1464.

In accordance with the filter 1400, a filter response having a 3 dB corner frequency at the output of the switch 1422 (and also the switches 1424, 1426 and 1428) as illustrated using graph 1472 is translated to the LO frequency on connection 1404 as illustrated by the graph 1474. The response is translated to +fLO. For simplicity, the 3LO, 5LO, 7LO, and other harmonics are omitted for ease of illustration. The 3 dB corner frequency, "$f_{-3dB}$" is calculated according to:

$$f_{-3dB} = \frac{1}{2\pi \left(\frac{TLO}{TON}\right)} \frac{1}{R_T * C}$$

where $R_T$ is the impedance ($Z_T$) of the tank circuit at the resonant frequency, which in this embodiment is the LO frequency, $T_{LO}=1/f_{LO}$, the time period of the LO signal, and $T_{ON}$ is the period during which each switch is on and C is the value of capacitance 1456 of FIG. 14.

Figure 15:
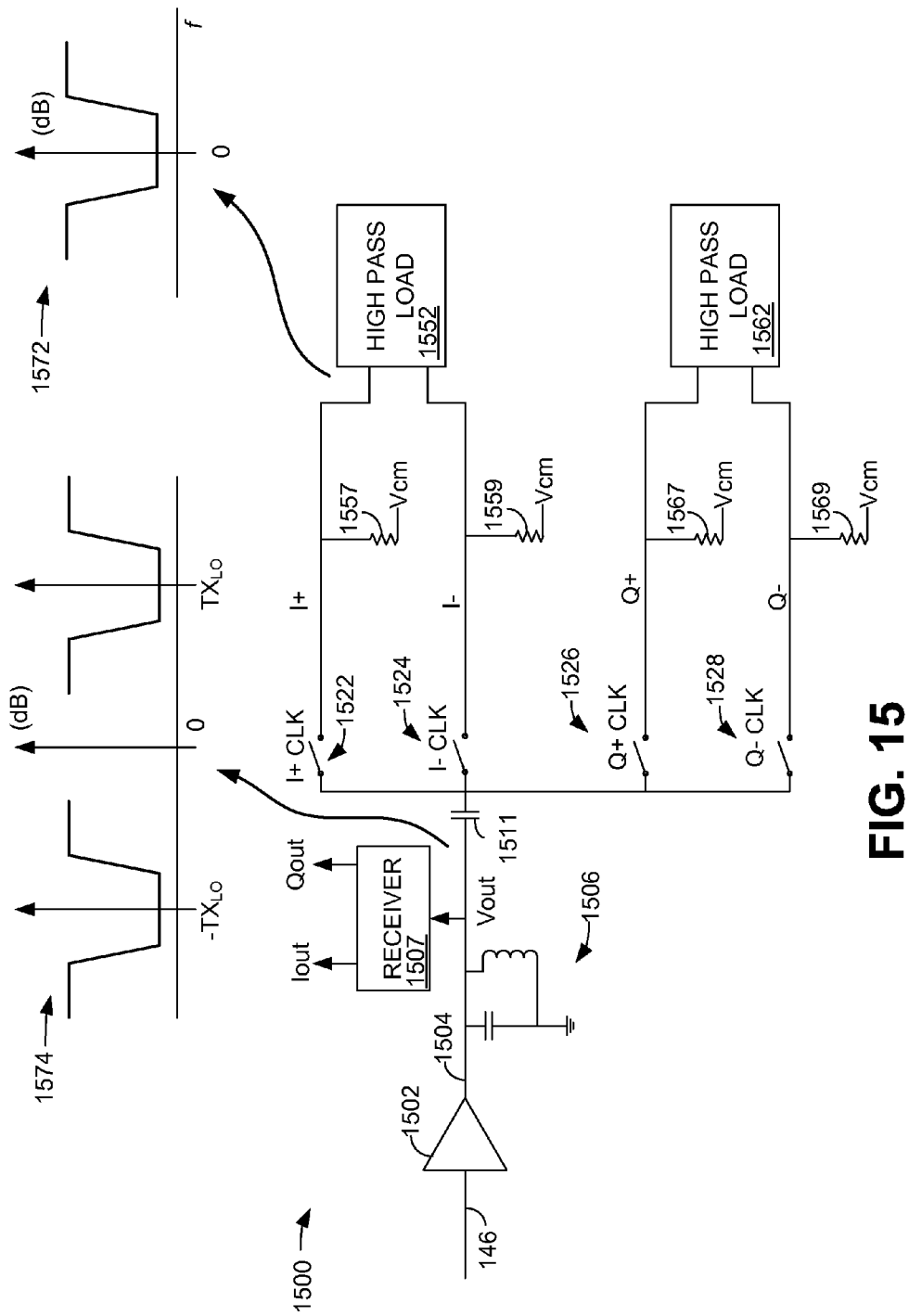
FIG. 15 a schematic diagram illustrating an alternative embodiment of a filter implemented using the approximate 25% duty cycle topology.

FIG. 15 is a schematic diagram illustrating an alternative embodiment of a filter implemented using the approximate 25% duty cycle topology. Elements in FIG. 15 that are similar to elements in FIG. 13 are labeled using the nomenclature 15XX, where XX refers to the similar element in FIG. 13.

The filter 1500 illustrates an embodiment of a high Q filter that provides a notch response at the transmit frequency. The input signal on connection 146 is supplied to an amplifier 1502. In an embodiment, the amplifier 1502 can be a trans-admittance amplifier, otherwise known as a Gm stage. The output of the amplifier 1502 on connection 1504 is a voltage signal.

The voltage signal on connection 1504 is provided to a tank circuit 1506. The tank circuit 1506 is similar to the tank circuit 306 described above. The output of the tank circuit 1506 on connection 1504 is a voltage signal, referred to as Vout. The signal on connection 1504 is provided to a receiver 1507, which can provide the I and Q output signals, regardless of the receiver implementation.

The voltage signal on connection 1504 is provided through a capacitance 1511 to switches 1522, 1524, 1526 and 1528. The switches 1522, 1524, 1526 and 1528 can be implemented using any switch technology such as, for example, bipolar junction transistor (BJT) technology, field effect transistor (FET) technology, or any other switching technology. The switches 1522, 1524, 1526 and 1528 are illustrated in FIG. 15 as simple single-pole single-throw switches to illustrate that any types of switches can be used to generate the switching signals described herein.

The output of the switches 1522 and 1524 are connected to circuit block 1552 and the output of the switches 1526 and 1528 are connected to circuit block 1562. The circuit blocks 1552 and 1562 provide load impedances with a high pass shape at baseband frequency, as shown in the graph 1572. One embodiment of such a termination impedance is the virtual ground connection of a high gain amplifier with a feedback resistor. In general, other implementations involving feedback circuits that synthesize inductive loads at baseband frequency (typically in the MHz to tens of MHz range) can be used.

In accordance with the filter 1500, a notch filter response at the LO frequency is created at connection 1504. If the LO frequency is chosen as the transmit frequency, then a notch response is created at the transmit frequency as shown by graph 1574. Having a notch response at the transmit frequency filters any transmit blocking signals at the receiver input.

Figure 16:
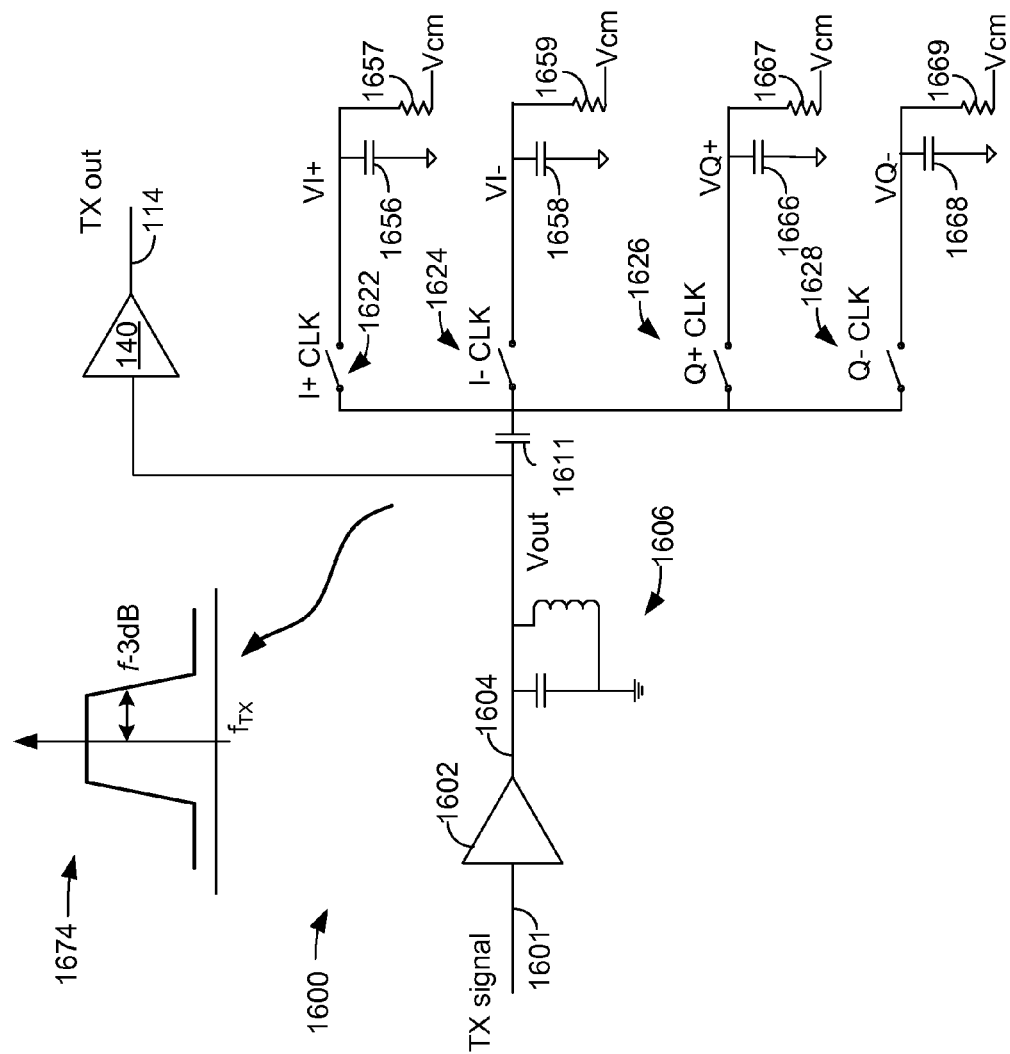
FIG. 16 is a schematic diagram illustrating an alternative embodiment of a filter implemented using the approximate 25% duty cycle topology, implemented to filter noise in a transmitter.

FIG. 16 is a schematic diagram illustrating an alternative embodiment of a filter implemented using the LO 2LO topology, implemented to filter noise in a transmitter.

The passive mixer 1600 illustrates an embodiment of a high Q filter implemented in a transmitter. The input signal on connection 1601 is a transmit input signal that can be supplied by any transmitter, including the transmitter 110 (FIG. 1). The transmit signal is supplied to an amplifier 1602. In an embodiment, the amplifier 1602 can be a trans-admittance amplifier, otherwise known as a Gm stage. The output of the amplifier 1602 on connection 1604 is a voltage signal.

The voltage signal on connection 1604 is provided to a tank circuit 1606. The tank circuit 1606 is similar to the tank circuit 306 described above. The output of the tank circuit 1606 on connection 1604 is a voltage signal, referred to as Vout, and in this example is a transmit signal that is supplied to a power amplifier or power amplifier driver 140 (FIG. 1). The amplifier 140 amplifies the transmit signal and provides a transmit signal on connection 114.

The voltage signal on connection 1604 is provided through a capacitance 1611 to switches 1622, 1624, 1626 and 1628. The switches 1622, 1624, 1626 and 1628 can be implemented using any switch technology such as, for example, bipolar junction transistor (BJT) technology, field effect transistor (FET) technology, or any other switching technology. The switches 1622, 1624, 1626 and 1628 are illustrated in FIG. 16 as simple single-pole single-throw switches to illustrate that any types of switches can be used to generate the switching signals described herein.

In the embodiment described herein, the in-phase (I) and quadrature-phase (Q) signals are differential. Therefore, the I signal includes an I+ signal and an I− signal. Similarly, the Q signal includes a Q+ signal and a Q− signal. The switch 1622 generates the I+ signal, the switch 1624 generates the I− signal, the switch 1626 generates the Q+ signal and the switch 1628 generates the Q− signal. The clock signals that drive the switches 1622, 1624, 1626 and 1628 are similar to the clock signals described in FIG. 8.

The output of the switch 1622 is terminated by a capacitance 1656 and a resistance 1657. The output of the switch 1624 is terminated by a capacitance 1658 and a resistance 1659. The output of the switch 1626 is terminated by a capacitance 1666 and a resistance 1667. The output of the switch 1628 is terminated by a capacitance 1668 and a resistance 1669.

In accordance with the filter 1600, a filter response is created by the LO and 2LO signals that drive the switches 1622, 1624, 1626 and 1628. These LO and 2LO signals are chosen to correspond to $TX_{LO}$ and $2TX_{LO}$, respectively. This arrangement provides the filter response on connection 1604 shown in graph 1674.

The filter response at the baseband frequency, a low pass response, is translated to the TX LO frequency by this topology. This creates a very high Q filter at node 1604 that rejects signals present outside the bandwidth of the TX signals. The dBc/Hz noise at 20 Mhz offset for GSM applications or higher frequency offsets of 45 MHz, 90 MHz, 180 Mhz for WCDMA applications are attenuated at node 1604 compared to the input node 1601. The bandwidth of the filter is adjusted and the resulting attenuation can be adjusted by choosing the desired value for capacitors 1656, 1658, 1666 and 1668.

As a by product of this topology, downconverted I and Q differential signals are available on the baseband capacitors 1656, 1658, 1666 and 1668. As an example, the outputs across the capacitors 1656, 1658, 1666 and 1668 can be used for calibration of the transmitter.

Figure 17:
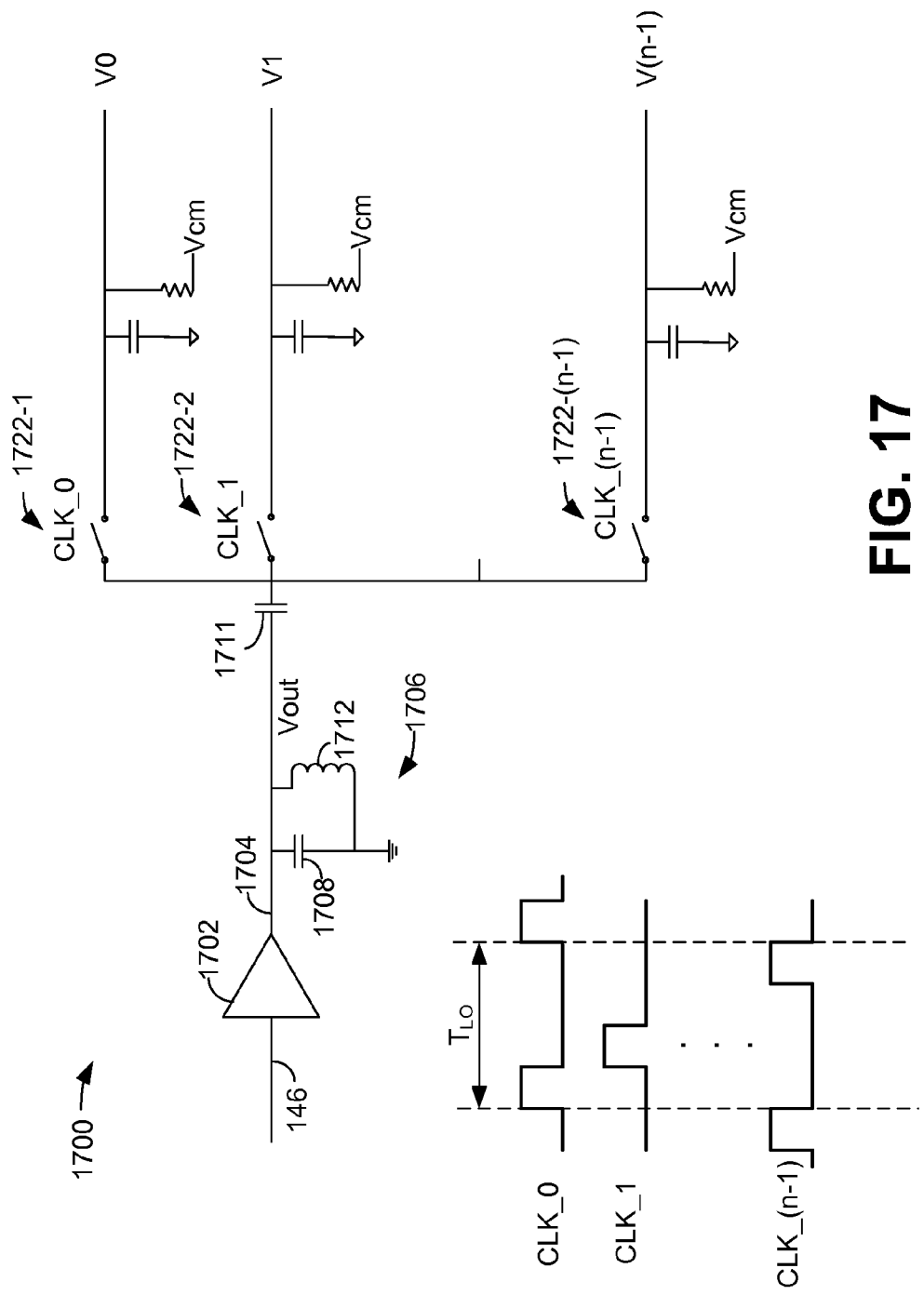
FIG. 17 is a schematic diagram showing a general implementation of a passive mixer and filter topology using n sample hold switches and having n baseband outputs.

FIG. 17 is a schematic diagram showing a general implementation of a passive mixer and filter topology using n sample hold switches and having n baseband outputs. The output of a low noise amplifier is received over connection 146. This is the input signal to the receiver 120 of FIG. 1. The input signal on connection 146 is supplied to an amplifier 1702. In an embodiment, the amplifier 1702 can be a trans-admittance amplifier, otherwise known as a Gm stage. The output of the amplifier 1702 on connection 1704 is a voltage signal.

The voltage signal on connection 1704 is provided to a tank circuit 1706. The tank circuit 1706 is similar to the tank circuit 306 described above.

The signal on connection 1704 is provided through a capacitance 1711 to switches 1722-1 through 1722-($n$−1). In the general implementation shown in FIG. 17, n switches 1722-1 through 1722-($n$−1) are used in the signal path, each switch having a duty cycle $\leq (100/n)$ %. The switches 1722-1 through 1722-($n$−1) are driven by a respective clock signal CLK_0 through CLK_(n−1). The implementation discussed in this application is the specific case for n=2. However, n baseband outputs could be used in receiver topologies where more than two samples per RF cycle might be required. As the number n increases, the gain approaches 0 dB. For example, a 3rd and 5th harmonic rejection receiver architecture might use n=8 to generate the 0, 45, 90, 135, 180, 225, 270 and 315 degree samples of the RF waveform. The outputs denoted by $V_0, V_1, \ldots V_{(n-1)}$ in FIG. 17, for the case of n=8, correspond to the 0, 45, 90, 135, 180, 225, 270 and 315 degree samples, respectively. A harmonic rejection mixer can be implemented using weighted summations of these multiple phases.

This technique is an effective way of splitting the RF signal in time domain in to n separate paths without adding extra circuit blocks that could severely degrade performance or increase power consumption and die area. The n-tap passive mixer or sample-hold mixer approach in the voltage domain retains the filter Q-enhancement benefits at node 146, that have been discussed in detail for n=2.

Figure 18:
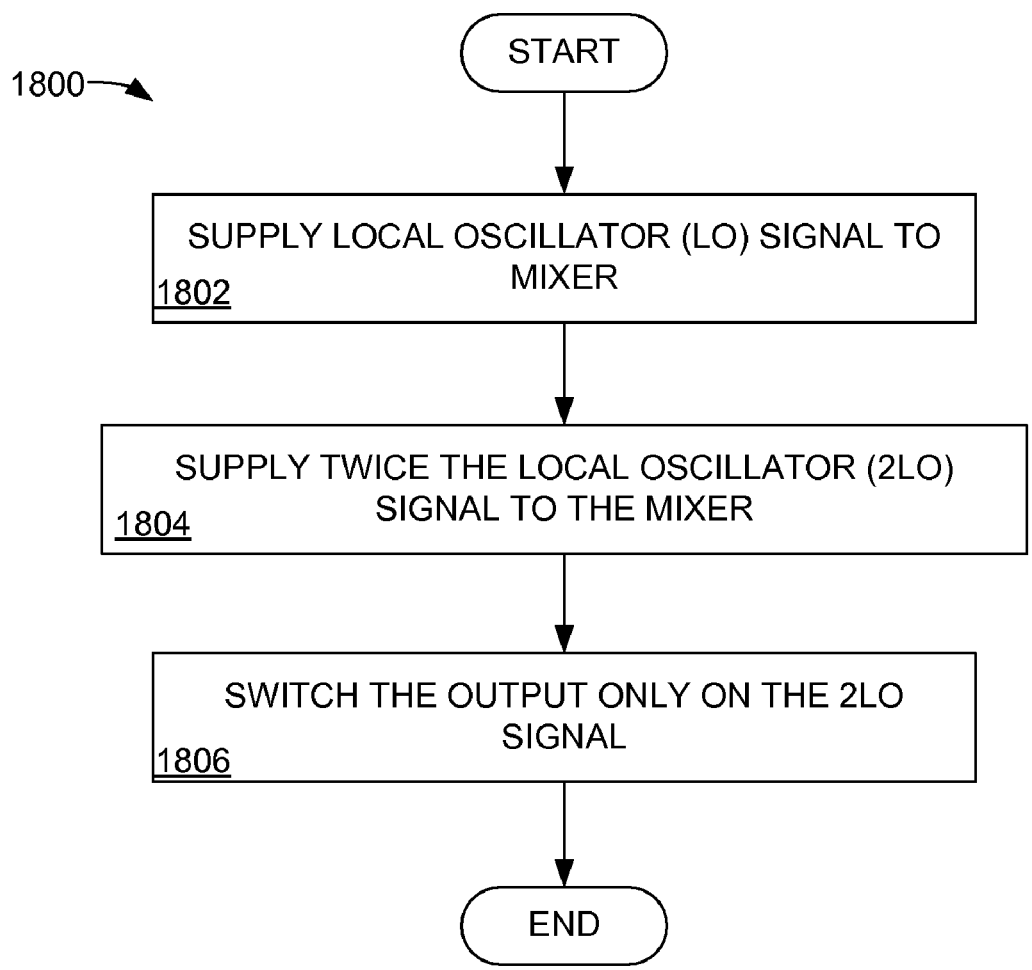
FIG. 18 is a flow chart describing the operation of an embodiment of the passive mixer and high Q RF filter using the LO 2LO topology.

FIG. 18 is a flow chart 1800 describing the operation of an embodiment of the passive mixer and filter using LO 2LO architecture. The blocks in the flowchart can be performed in or out of the order shown by the elements described above.

In block 1802, an LO signal is supplied to a mixer core. In block 1804, a signal at twice the LO signal (2LO) is supplied to the mixer core. In block 1806, the output of the mixer core switches on the 2LO signal.

While various embodiments of the invention have been described, it will be apparent to those of ordinary skill in the art that many more embodiments and implementations are possible that are within the scope of the invention. For example, the invention is not limited to a specific type of radio receiver or transceiver. Embodiments of the invention are applicable to different types of radio receivers and transceivers and are applicable to any transmitter or receiver that upconverts or downconverts a received signal or that filters a signal.

What is claimed is:

1. A passive mixer, comprising:
a switching architecture configured to generate differential in-phase (I) and differential quadrature-phase (Q) signals, wherein generating uses differential components of a first local oscillator (LO) signal, wherein the switching architecture uses differential components of a second local oscillator (2LO) signal that is at a frequency that is twice a frequency of the first local oscillator (LO) signal, wherein the switching architecture is configured to switch an input signal on transitions of the second local oscillator (2LO) signal, wherein the switching architecture comprises a switch for each differential in-phase (I) and differential quadrature-phase (Q) signal, and wherein the voltage swing between the output of the switch and the input of the switch is substantially eliminated.

2. The passive mixer of claim 1, in which the switching architecture results in an effective local oscillator (eLO) signal that switches the input signal during a time period in which the first local oscillator (LO) is stable.

3. The passive mixer of claim 2, in which
each switch is operable at the frequency of the effective local oscillator (eLO) signal.

4. The passive mixer of claim 1, in which each switch further comprises:
a first set of switches configured to be controlled by the second local oscillator (2LO) signal; and
a second set of switches configured to be controlled by the first local oscillator (LO) signal.

5. A passive filter, comprising:
a filtering mixer configured to receive an output of an amplifier, wherein the filtering mixer provides a band-pass filter response; and
a switching architecture within the filtering mixer, the switching architecture configured to generate differential in-phase (I) and differential quadrature-phase (Q) signals using differential components of a first local oscillator (LO) signal, and differential components of a second local oscillator (2LO) signal that is at a frequency that is twice a frequency of the first local oscillator (LO) signal.

6. The passive filter of claim 5, in which the switching architecture further comprises:
a single switch for each differential in-phase (I) and differential quadrature-phase (Q) signal, each switch operable at the frequency of the effective local oscillator (eLO) signal.

7. The passive filter of claim 5, in which the filtering mixer provides a notch filter response at a transmit frequency.

8. A method for mixing a signal, comprising:
providing an input signal;
generating, by a switching architecture, differential in-phase (I) and differential quadrature-phase (Q) signals, wherein generating uses differential components of a first local oscillator (LO) signal, and wherein the switching architecture uses differential components of a second local oscillator (2LO) signal that is at a frequency that is twice a frequency of the first local oscillator (LO) signal;
switching the input signal on transitions of the differential second local oscillator (2LO) signal
providing the differential components of the first local oscillator (LO) signal, and the differential components of the second local oscillator (2LO) signal that is at a frequency that is twice a frequency of the first local oscillator (LO) signal to a filtering mixer;
providing a reference frequency signal to the filtering mixer; and
filtering a radio frequency (RF) input signal.

9. The method of claim 8, in which the switching architecture results in an effective local oscillator (eLO) signal that switches the input signal during a time period in which the first local oscillator (LO) is stable.

10. The method of claim 8, wherein the reference frequency is a signal corresponding to a receive LO signal of 2 times the receive LO frequency.

11. The method of claim 8, wherein the reference frequency is a signal corresponding to a transmit LO signal of 2 times the transmit LO frequency.

12. A passive mixer, comprising:
a switching architecture configured to generate differential in-phase (I) and differential quadrature-phase (Q) signals using differential components of the in-phase (I) and quadrature-phase (Q) signals operating on transitions of an approximate 25% duty cycle signal, wherein the switching architecture forms a high Q filter that provides a notch response.

13. The passive mixer of claim 12, wherein the switching architecture is configured to switch the input signal on transitions of the approximate 25% duty cycle signal.

* * * * *